(12) United States Patent
Nishimura et al.

(10) Patent No.: US 7,580,303 B2
(45) Date of Patent: Aug. 25, 2009

(54) SEMICONDUCTOR MEMORY HAVING A PRECHARGE VOLTAGE GENERATION CIRCUIT FOR REDUCING POWER CONSUMPTION

(75) Inventors: Koichi Nishimura, Kawasaki (JP); Shinichiro Ikemasu, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/580,058

(22) Filed: Oct. 13, 2006

(65) Prior Publication Data
US 2007/0091703 A1 Apr. 26, 2007

Related U.S. Application Data

(63) Continuation of application No. PCT/JP2004/008741, filed on Jun. 22, 2004.

(51) Int. Cl.
G11C 7/00 (2006.01)
(52) U.S. Cl. .................. 365/203; 365/211; 365/189.09; 365/227
(58) Field of Classification Search .................. 365/211, 365/189.09, 227, 203
See application file for complete search history.

(56) References Cited

U.S. PATENT DOCUMENTS

| | | | | |
|---|---|---|---|---|
| 4,413,330 | A * | 11/1983 | Chao et al. | 365/205 |
| 4,443,868 | A * | 4/1984 | Takemae | 365/205 |
| 5,703,814 | A * | 12/1997 | Nishimura et al. | 365/189.09 |
| 6,084,812 | A | 7/2000 | Joo | |
| 6,181,637 | B1 * | 1/2001 | Nishimura et al. | 365/230.06 |
| 6,297,995 | B1 | 10/2001 | McConnell et al. | |
| 6,333,864 | B1 * | 12/2001 | Nishimura et al. | 363/78 |
| 6,788,159 | B2 * | 9/2004 | Takahashi et al. | 331/176 |
| 6,868,026 | B2 * | 3/2005 | Fujioka | 365/222 |
| 6,947,347 | B2 * | 9/2005 | Fujioka | 365/227 |
| 2001/0043493 | A1 * | 11/2001 | Fujioka et al. | 365/189.09 |
| 2003/0227809 | A1 * | 12/2003 | Schwartz | 365/211 |

FOREIGN PATENT DOCUMENTS

| | | |
|---|---|---|
| JP | 60-83293 A | 5/1985 |
| JP | 1-192098 A | 8/1989 |
| JP | 08-297974 A | 11/1996 |

(Continued)

OTHER PUBLICATIONS

IPER, International Appln. No. PCT/JP2004/008741, issued Jan. 11, 2007, 8 pgs.

(Continued)

*Primary Examiner*—Fernando N Hidalgo
(74) *Attorney, Agent, or Firm*—Arent Fox LLP

(57) ABSTRACT

A precharge voltage generating circuit outputs any of a plurality of kinds of precharge voltages in accordance with an ambient temperature. A precharge circuit supplies the precharge voltage to a bit line during the nonaccess of a dynamic memory cell. A sense amplifier amplifies a difference between the voltage of a data signal read from the dynamic memory cell onto the bit line and the supplied precharge voltage. The precharge voltage is altered in accordance with the ambient temperature, whereby the read margin of the sense amplifier can be changed, and the worst value of the data retaining time of the memory cell can be improved. As a result, the frequency of refreshing of the memory cell can be lowered, reducing power consumption and a standby current.

20 Claims, 16 Drawing Sheets

FOREIGN PATENT DOCUMENTS

| | | |
|---|---|---|
| JP | 11-53882 A | 2/1999 |
| JP | 2000-156093 A | 6/2000 |
| JP | 2002-358799 A | 12/2002 |
| JP | 2003-173679 A | 6/2003 |

OTHER PUBLICATIONS

Written Opinion, International Appln. No. PCT/JP2004/008741, issued Jan. 11, 2007, 4 pgs.

Chinese Office Action, dated Jan. 23, 2009, 2 pages.

* cited by examiner

SEMICONDUCTOR MEMORY HAVING A PRECHARGE VOLTAGE GENERATION CIRCUIT FOR REDUCING POWER CONSUMPTION

CROSS REFERENCE TO RELATED APPLICATION

This application is a continuation application of International Application PCT/JP 2004/008741, filed Jun. 22, 2004, and designating the U.S.

BACKGROUND OF THE INVENTION

1. Field of the Invention

The present invention relates to a technique for reducing the power consumption of a semiconductor memory which has dynamic memory cells that need to be cyclically refreshed.

2. Description of the Related Art

A memory capacity necessary for a portable terminal such as mobile phone has been on the rise year by year. In this situation, a dynamic RAM (hereinafter, "DRAM") has come to be used as the work memory of the portable terminal instead of a conventional static RAM (hereinafter, "SRAM"). Since the DRAM is smaller than the SRAM in the number of elements constituting each memory cell, the chip size thereof can be made smaller, and the chip cost thereof can be made lower than that of the SRAM.

On the other hand, a semiconductor memory which is mounted in the portable terminal is required to be of low power consumption for the purpose of making a battery usable for a long time. Unlike the SRAM, the DRAM requires periodic refresh operations in order to retain data written into the memory cells. Therefore, in the case where the DRAM is used as the work memory of the portable terminal, electric power is consumed and the battery is dissipated just for retaining the data, even while the portable terminal is not in use.

As disclosed in, for example, Japanese Unexamined Patent Application Publication No. 2003-173679, a conventional DRAM precharges the voltages of complementary bit lines to ½ of the power supply voltage of a sense amplifier (between "1 data" and "0 data") during the nonaccess of memory cells. Thus, electric power which is necessary for a precharge operation after refresh can be reduced, so that electric power during standby is reduced. Besides, the precharge voltage of one of the complementary bit lines is used as a reference voltage, whereby the read speeds of the memory cell storing the "1 data" therein and the memory cell storing the "0 data" therein can be equalized.

A condition under which the data disappears due to leak differs between in a case where the "1 data" is stored in the memory cell and in a case where the "0 data" is stored therein. A major leak component is the junction leak current of the memory cell in the case of the "1 data", and it is a leak current through the capacitor insulator of the memory cell in the case of the "0 data". The junction leak current has a temperature-dependency, and the leak magnitude thereof increases more at a higher temperature. In contrast, the leak current through the capacitor insulator has no temperature-dependency. That is, the leak magnitude does not increase even at a high temperature.

Accordingly, the value of the data retaining time of the memory cell is worst at the high temperature at which the junction leak current increases (at the storage of the "1 data").

When the data retaining time is short, a refresh cycle needs to be shortened, increasing a standby current.

SUMMARY OF THE INVENTION

An object of the present invention is to reduce the power consumption of a semiconductor memory having dynamic memory cells. Especially, an object thereof is to increase the data retaining time of a memory cell at a high temperature, thereby to lengthen a refresh cycle and to reduce a standby current.

In the first aspect of the invention, a precharge voltage generating circuit outputs any of a plurality of kinds of precharge voltages in accordance with an ambient temperature. A precharge circuit supplies the precharge voltage supplied from the precharge voltage generating circuit, to a bit line during the nonaccess of the dynamic memory cell. A sense amplifier amplifies a difference between the voltage of a data signal read from the dynamic memory cell onto the bit line and the supplied precharge voltage. That is, the precharge voltage is used as a reference voltage. The read margin of the data signal which the sense amplifier amplifies can be changed by altering the precharge voltage. The data retaining time of the memory cell extends owing to the enhancement of the read margin. In general, the data retaining time of the memory cell which retains "1 data" decreases as the ambient temperature increases. Accordingly, the data retaining time of the "1 data" can be lengthened by altering the precharge voltage in accordance with the temperature. As a result, the frequency of refreshing the memory cells can be lowered, and power consumption can be reduced. Especially, it is possible to attain a great effect of reducing a standby current in a standby period in which only refresh operations are cyclically executed.

In a preferable example of the first aspect of the invention, the precharge voltage generating circuit outputs a first precharge voltage when the ambient temperature is equal to or lower than a boundary temperature, and it outputs a second precharge voltage when the ambient temperature is higher than the boundary temperature. That is, the precharge voltage generating circuit outputs either of the two kinds of precharge voltages in accordance with the ambient temperature. Minimizing the number of the kinds of the precharge voltages switched in accordance with the ambient temperature can facilitate a switching control, and prevent a circuit scale from enlarging.

In a preferable example of the first aspect of the invention, the sense amplifier changes a voltage of the bit line to a power supply voltage VII or a ground voltage by the amplifying operation. The first and second precharge voltages which the precharge voltage generating circuit outputs are VII/2 and a voltage lower than VII/2, respectively. As stated above, the data retaining time of the memory cell retaining the "1 data" decreases as the ambient temperature increases. Lowering the precharge voltage at the high temperature and increasing the read margin of the "1 data" makes it possible to increase the worst value of the data retaining time. As a result, the frequency of refreshes lowers, so that the standby current can be reduced.

In a preferable example of the first aspect of the invention, the sense amplifier changes the voltage of the bit line to a power supply voltage VII or a ground voltage by the amplifying operation. The first and second precharge voltages which the precharge voltage generating circuit outputs are a voltage higher than VII/2 and VII/2, respectively. That is, the precharge voltage heightens at the low temperature, the read margin of the "1 data" decreases, and the read margin of "0 data" increases. The read margin of the "1 data" at the low temperature, which is originally sufficiently long, is decreased, and the decrease is allocated to the read margin of the "0 data", whereby the data retaining time (worst value) at the low temperature can be lengthened. As a result, the frequency of refreshes lowers, so that the standby current can be reduced.

In a preferable example of the first aspect of the invention, the precharge voltage generating circuit is capable of generating a precharge voltage which changes continuously in accordance with a change in the ambient temperature. By way of example, the semiconductor memory is formed with a temperature sensor which outputs an analog value corresponding to the ambient temperature. The precharge voltage generating circuit outputs the precharge voltage corresponding to the analog value outputted from the temperature sensor. This precharge voltage generating circuit sets the precharge voltage such that the lower the ambient temperature is, the higher the precharge voltage is, and it sets the precharge voltage such that the higher the ambient temperature is, the lower the precharge voltage is. The precharge voltage is continuously changed depending upon the ambient temperature, whereby the data retaining time can be controlled at a high precision in accordance with the ambient temperature.

In a preferable example of the first aspect of the invention, the temperature sensor detects the ambient temperature and outputs the detected temperature as a temperature detection signal. The precharge voltage generating circuit outputs any of precharge voltages in accordance with the temperature detection signal outputted from the temperature sensor. The temperature sensor is built in the semiconductor memory, whereby the ambient temperature can be precisely detected. As a result, the precharge voltage can be generated at a high precision, and the data retaining time can be controlled at a high precision in accordance with the ambient temperature.

In a preferable example of the first aspect of the invention, the precharge voltage generating circuit outputs any of a plurality of kinds of precharge voltages in accordance with the temperature detection signal indicating the ambient temperature which is received by an external terminal. In a case, for example, where a temperature sensor is built in a system in which the semiconductor memory is mounted, the precharge voltage is generated by utilizing the output of the temperature sensor, thereby preventing the circuit from becoming redundant, and reducing a system cost.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Now, embodiments of the present invention will be described in conjunction with the drawings. Double circles in the figures indicate external terminals. Each of signal lines indicated by thick lines in the figures is configured of a plurality of lines. Besides, part of each of blocks to which the thick lines are connected is configured of a plurality of circuits. The same signs as terminal names are used for signals which are supplied through the external terminals. Besides, the same signs as signal names are used for signal lines to which signals are transmitted.

Figure 1:
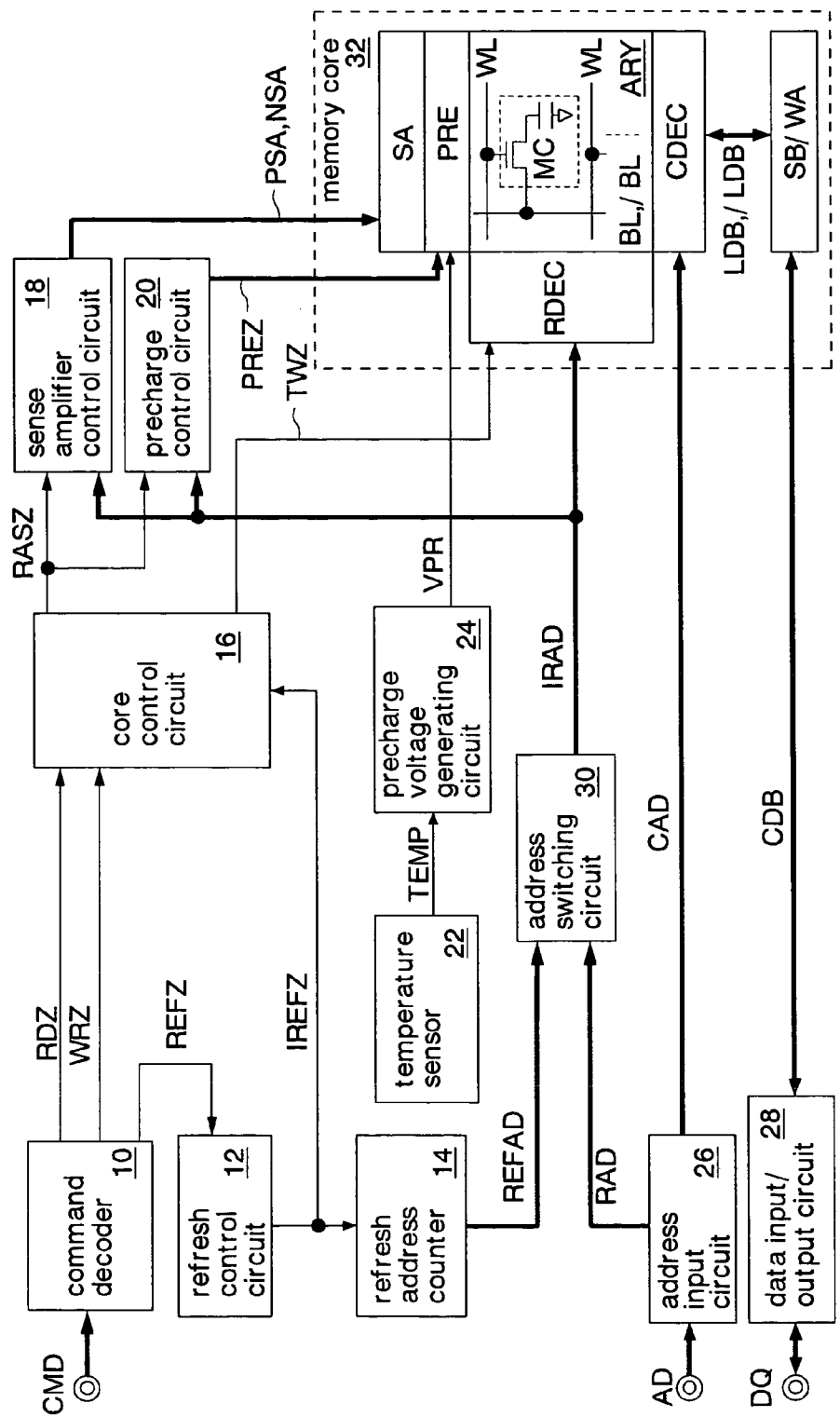
FIG. 1 is a block diagram showing the first embodiment of the semiconductor memory of the present invention.

FIG. 1 shows the first embodiment of the semiconductor memory of the invention. This semiconductor memory is formed as a dynamic RAM chip (hereinafter, "DRAM") by using a CMOS process on a silicon substrate. The DRAM is used as, for example, a work memory which is mounted in a portable equipment such as mobile phone.

The DRAM includes a command decoder 10, a refresh control circuit 12, a refresh address counter 14, a core control circuit 16, a sense amplifier control circuit 18, a precharge control circuit 20, a temperature sensor 22, a precharge voltage generating circuit 24, an address input circuit 26, a data input/output circuit 28, an address switching circuit 30 and a memory core 32. Note that, in FIG. 1, only principal signals necessary for the description of the invention are shown.

The command decoder 10 receives a command signal CMD supplied from an external terminal (for example, a chip select signal /CS, a row address strobe signal /RAS, a column address strobe signal /CAS, and a write enable signal /WE). In compliance with the received command signal CMD, the command decoder 10 outputs a read control signal RDZ for executing a read operation, a write control signal WRZ for executing a write operation, a refresh control signal REFZ for executing a refresh operation, and so forth.

The refresh control circuit 12 outputs an internal refresh control signal IREFZ in response to the refresh control signal REFZ. The refresh address counter 14 operates when the DRAM is in an autorefresh mode or a selfrefresh mode. The selfrefresh mode is an operation mode in which only the refresh operations are cyclically executed. The refresh address counter 14 executes a count operation in response to the internal refresh control signal IREFZ or a refresh request signal outputted from a built-in refresh timer, so as to sequentially generate refresh address signals REFAD.

The core control circuit 16 outputs a row timing signal RASZ, a word timing signal TWZ, or the like when it has received any of the read control signal RDZ, write control signal WRZ and internal refresh control signal IREFZ. The row timing signal RASZ is a basic timing signal for operating the memory core 32. The word timing signal TWZ is a timing signal which determines the activation period of word lines WL.

In order to operate a sense amplifier SA in an area indicated by an internal row address signal IRAD, the sense amplifier control circuit 18 activates sense amplifier activating signals PSA and NSA corresponding to the area, in synchronism with the row timing signal RASZ. In order to stop the operation of a precharge circuit PRE in the area indicated by the internal row address signal IRAD, the precharge control circuit 20 inactivates a precharge signal PREZ corresponding to the area, to a low level in synchronism with the row timing signal RASZ.

The temperature sensor 22 detects the chip temperature (ambient temperature) of the DRAM, and outputs a temperature detection signal TEMP in accordance with the detected temperature. Concretely, the temperature detection signal TEMP is set at a high level when the ambient temperature is lower than a preset boundary temperature BT1 (refer to FIG. 7; 40° C. by way of example), and at a low level when the ambient temperature is higher than the boundary temperature BT1.

The precharge voltage generating circuit 24 sets a precharge voltage VPR at a value being half (VII/2) of an internal power supply voltage VII when the temperature detection signal TEMP is at the high level, whereas it sets the precharge voltage VPR at a value lower than VII/2 when the temperature detection signal TEMP is at the low level. Here, the precharge voltage VPR is used as the reset voltage (equalizing voltage) of bit lines BL and /BL during the nonaccess of a memory cell MC.

Here, the internal power supply voltage VII is generated in such a way that an external power supply voltage VDD supplied from outside the DRAM through a power supply terminal is stepped down by an internal power supply voltage generating circuit not shown.

The address input circuit 26 receives an address signal AD supplied from an address terminal, and outputs the received signal as a row address signal RAD and a column address signal CAD. The row address signal RAD is supplied in order to select the word line WL and sense amplifier SA in the read operation, write operation and refresh operation, and to select the precharge circuit PRE to-be-inactivated. The column address signal CAD is supplied in order to select the bit lines BL and /BL in the read operation and write operation.

The data input/output circuit 28 outputs read data which is transferred from the memory core 32 through a common data bus CDB, to an external terminal DQ in the read operation. This data input/output circuit 28 receives write data through the external terminal DQ in the write operation, so as to transfer the received data to the memory core 32 through the common data bus CDB.

The address switching circuit 30 outputs the row address signal RAD as the internal row address signal IRAD when the read operation, the write operation, or the refresh operation responsive to a refresh command from outside the DRAM is executed. The address switching circuit 30 outputs the refresh address signal REFAD as the internal row address signal IRAD when the refresh operation is executed in the autorefresh mode or in the selfrefresh mode. That is, the row address signal RAD supplied from outside is selected in the read operation, the write operation, and the refresh operation responsive to the refresh command, and the refresh address signal REFAD generated inside is selected in the refresh operation in the autorefresh mode or the selfrefresh mode.

The memory core 32 includes a memory array ARY, a row decoder RDEC, a column decoder CDEC, the sense amplifier SA, the precharge circuit PRE, a sense buffer SB and a write amplifier WA. The memory array ARY includes a plurality of volatile memory cells MC (dynamic memory cells) which are arranged in the shape of a matrix, and a plurality of word lines WL and a plurality of bit line pairs BL and /BL which are connected to the memory cells MC.

The memory cell MC includes a capacitor which serves to retain data as charges, and a transfer transistor which is arranged between the capacitor and the bit line BL (or /BL). The gate of the transfer transistor is connected to the word line WL.

The row decoder RDEC includes a main word decoder and a sub word decoder neither of which is shown. The main word decoder selects any of main word lines in accordance with the internal row address signal IRAD. The sub word decoder selects one of the four word lines WL corresponding to the activated main word line, in accordance with the internal row address signal IRAD. The column decoder CDEC outputs a column line signal for turning ON a column switch (not shown) which connects the bit line BL and a local data bus line LDB, and the bit line /BL and a local data bus line /LDB, respectively, in accordance with the column address signal CAD.

The sense amplifier SA is activated for a period for which the sense amplifier activating signals PSA and NSA are at a low level and a high level, respectively. The precharge circuit PRE is activated for a period for which the precharge signal PREZ is at a high level, so as to supply the precharge voltage VPR to the bit lines BL and /BL.

The sense buffer SB amplifies the signal magnitude of the read data on the local data bus lines LDB and /LDB in the read operation, so as to output the amplified signal magnitude to the common data bus CDB. The write amplifier WA amplifies the signal magnitude of the write data on the common data bus CDB in the write operation, so as to output the amplified signal magnitude to the local data bus lines LDB and /LDB.

Figure 2:
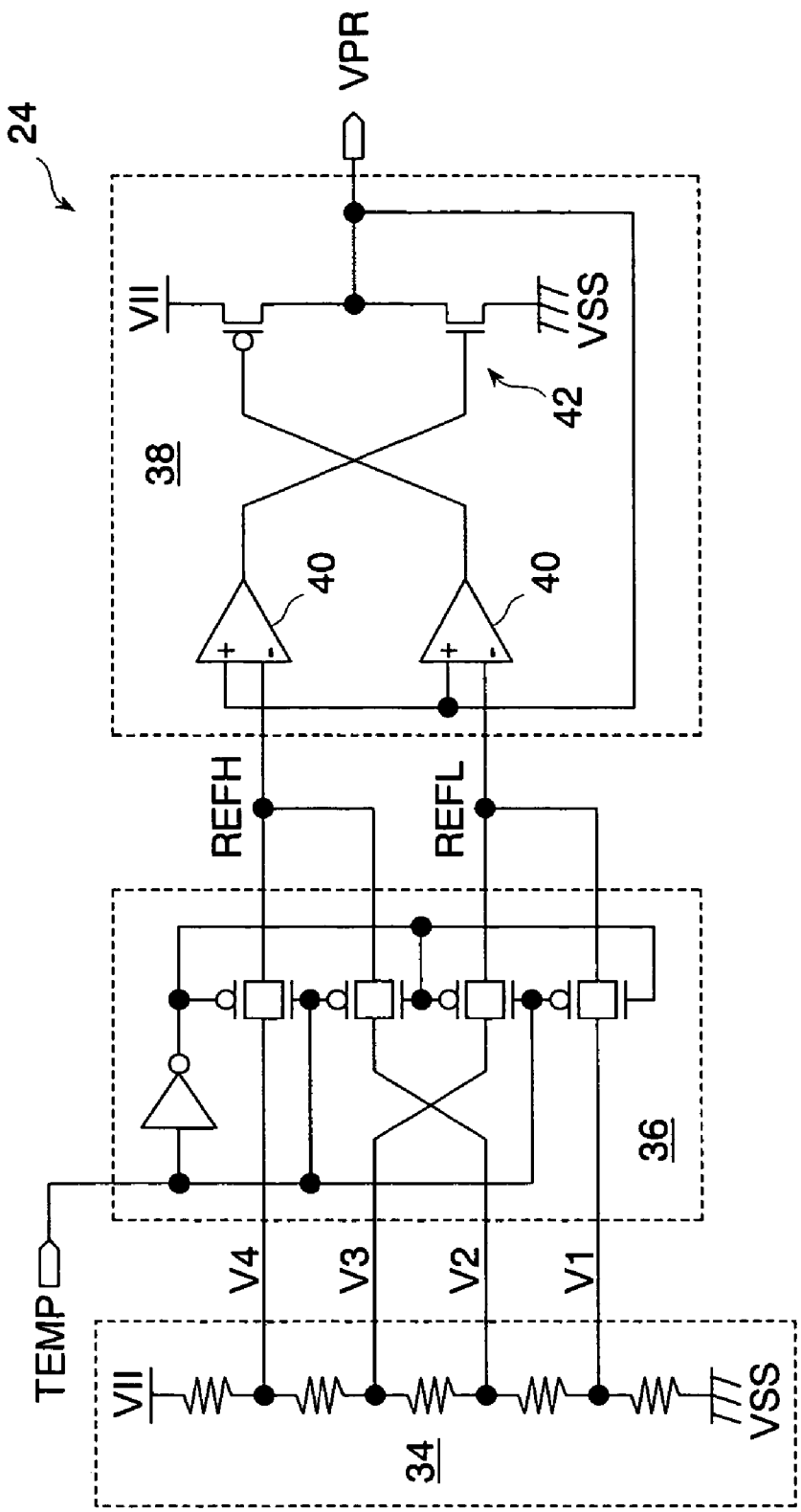
FIG. 2 is a circuit diagram showing the details of a precharge voltage generating circuit shown in FIG. 1.

FIG. 2 shows the details of the precharge voltage generating circuit 24 shown in FIG. 1. The precharge voltage generating circuit 24 includes a reference voltage generating unit 34, a switch unit 36 and a precharge voltage generating unit 38.

The reference voltage generating unit 34 includes a plurality of high-resistance resistors which are serially connected between the internal power supply line VII and a ground line VSS. Reference voltages V1-V4 are respectively outputted from the connection nodes of those two of the resistors which are adjacent to each other. The switch unit 36 includes CMOS transmission gates, and an inverter which controls the CMOS transmission gates. This switch unit 36 supplies the reference voltages V3 and V4 to the precharge voltage generating unit 38 as reference voltages REFL and REFH when the temperature detection signal TEMP is at the high level, whereas it supplies the reference voltages V1 and V2 to the precharge voltage generating unit 38 as the reference voltages REFL and REFH when the temperature detection signal TEMP is at the low level.

The precharge voltage generating unit 38 includes a pair of differential amplifiers 40 (current mirror) and an output circuit 42 of pushpull type. Each of the differential amplifiers 40 compares the corresponding reference voltage REFL or REFH with the precharge voltage VPR supplied back from the output circuit 42, and it outputs the high level or low level to the precharge voltage line VPR in accordance with the result of the comparison. The output circuit 42 is configured of a pMOS transistor and an nMOS transistor which are serially connected between the internal power supply line VII and the ground line VSS. The sources of the pMOS transistor and nMOS transistor are respectively connected to the internal power supply line VII and ground line VSS. The output of the differential amplifier 40 which receives the reference voltage REFL, is connected to the gate of the pMOS transistor. The output of the differential amplifier 40 which receives the reference voltage REFH, is connected to the gate of the nMOS transistor.

Owing to the operation of the precharge voltage generating unit 38, the precharge voltage VPR is set between the reference voltages V3 and V4 when the temperature detection signal TEMP is at the high level (the ambient temperature is low), and it is set between the reference voltages V1 and V2 when the temperature detection signal TEMP is at the low level (the ambient temperature is high). That is, the precharge voltage VPR becomes lower when the ambient temperature is high, than when the ambient temperature is low.

Figure 3:
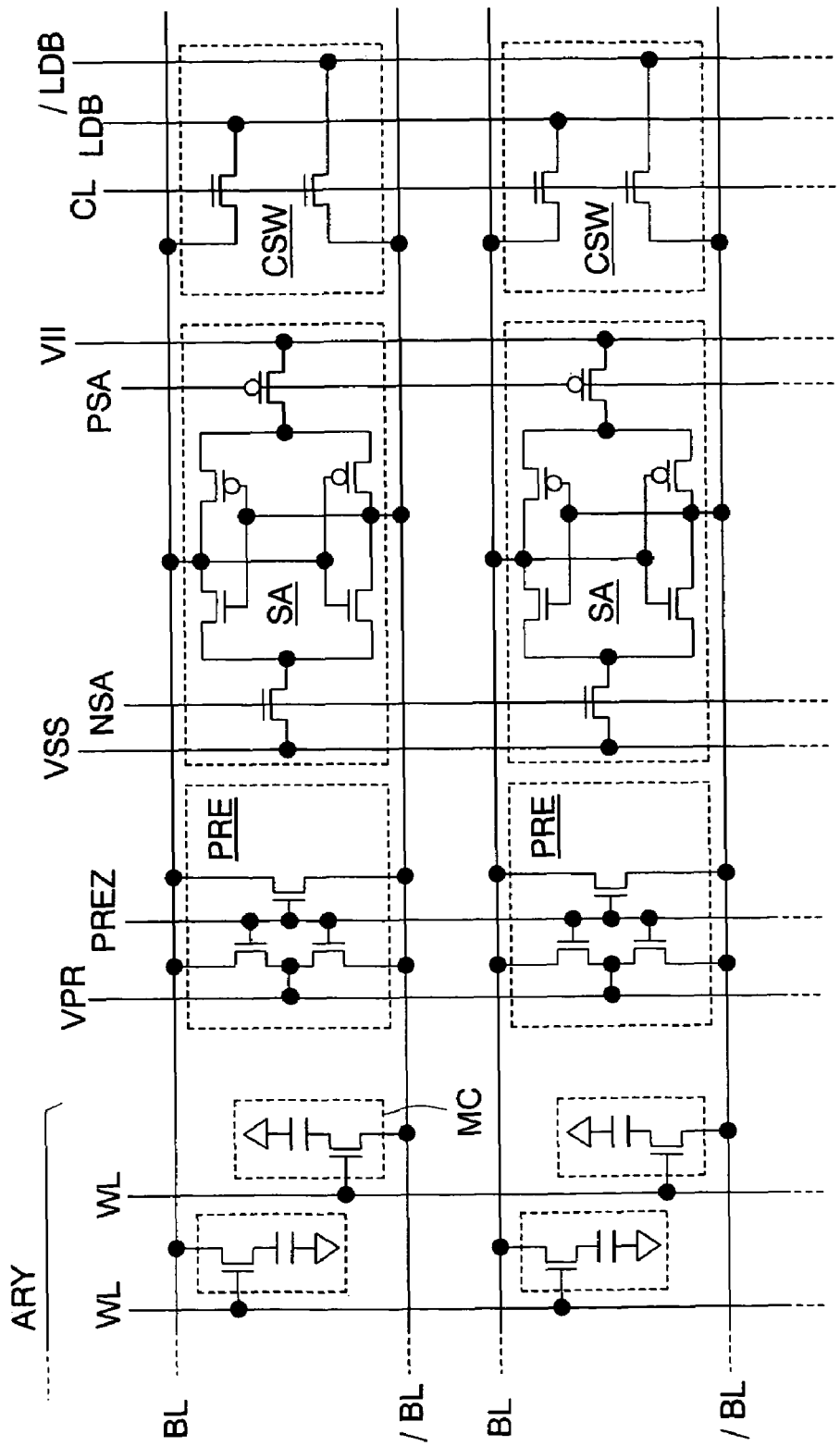
FIG. 3 is a circuit diagram showing the details of a memory core shown in FIG. 1.

FIG. 3 shows the details of the memory core 32 shown in FIG. 1. The precharge circuit PRE is configured of a pair of nMOS transistors for connecting the complementary bit lines BL and /BL to the precharge voltage line VPR, respectively, and an nMOS transistor for connecting the bit lines BL and /BL to each other. The gates of the nMOS transistors of the precharge circuit PRE receive the precharge signal PREZ. While receiving the precharge signal PREZ of the high level, the precharge circuit PRE supplies the precharge voltage VPR to the bit lines BL and /BL and equalizes these bit lines BL and /BL.

The sense amplifier SA includes a pair of latches whose inputs and outputs are connected to each other, and a pMOS transistor and an nMOS transistor which serve to connect the power supply terminals and ground terminals of the latches to the internal power supply line VII and ground line VSS, respectively. The input of each latch (as is also the output of the other latch) is connected to the bit line BL or /BL. The gates of the pMOS transistor and nMOS transistor are respectively connected to the signal lines of the sense amplifier activating signals PSA and NSA. The sense amplifier SA operates in synchronism with the activation of the sense amplifier activating signal PSA or NSA, so as to amplify the signal magnitude of the data on the bit lines BL and /BL.

The column switch CSW is configured of an nMOS transistor which connects the bit line BL and the local data bus line LDB, and an nMOS transistor which connects the bit line /BL and the local data bus line /LDB. The gates of the respective nMOS transistors receive a column line signal CL which is generated by the column decoder CDEC. In the read operation, read data signals on the bit lines BL and /BL as have been amplified by the sense amplifier SA are respectively transmitted to the local data bus lines LDB and /LDB through the column switch CSW. In the write operation, write data signals supplied through the local data bus lines LDB and /LDB are respectively written into the memory cell MC through the bit lines BL and /BL.

Figure 4:
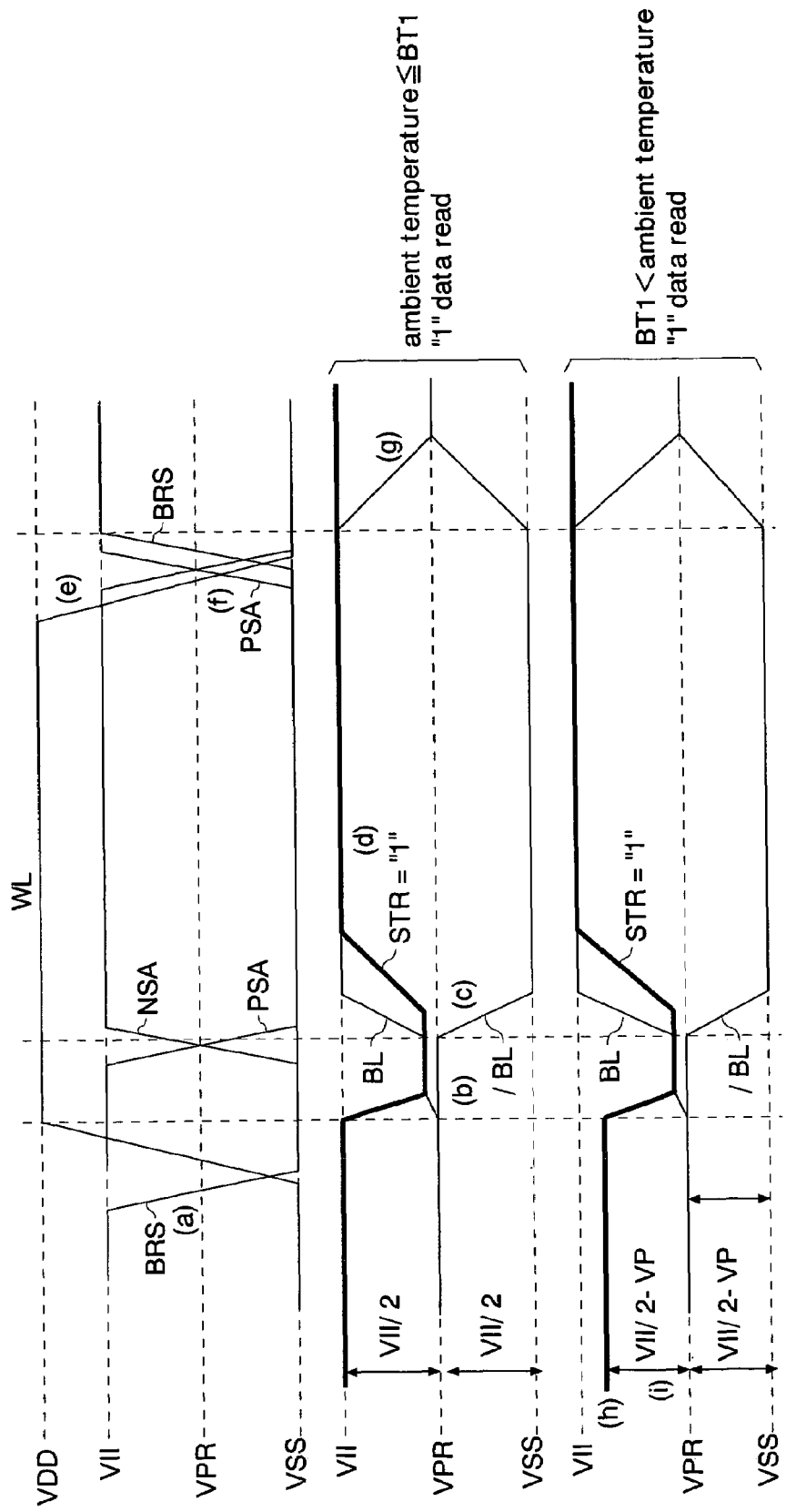
FIG. 4 is a waveform diagram showing the operation of the memory core in the case where "1 data" is read from a memory cell, in the first embodiment.

FIG. 4 shows the operation of the memory core 32 in the case where "1 data" is read from the memory cell MC, in the first embodiment. Incidentally, the precharge voltage VPR is set at VII/2 when the ambient temperature is equal to or lower than the boundary temperature BT1 (for example, 40° C.), and it is set to be VP lower than VII/2, when the ambient temperature exceeds the boundary temperature BT1, that is, it is a high temperature. Each of thick lines in the figure indicates the cell voltage STR of the memory cell MC for which the read operation is executed.

First, when a read command or the refresh command is supplied, the precharge signal PREZ corresponding to an area which includes the memory cell MC to-be-accessed is inactivated to the low level by the control of the core control circuit 16, and the precharge operation of the bit lines BL and /BL are stopped (FIG. 4(a)). Subsequently, the word line WL is activated, and the "1 data" is read from the memory cell MC onto, for example, the bit line BL. Since the bit line /BL is held at the precharge voltage VPR, a voltage difference appears between the bit lines BL and /BL (FIG. 4(b)). Incidentally, the activation voltage of the word line WL is not restricted to the external power supply voltage VDD. It is also allowed to use, for example, a raised voltage obtained by boosting the external power supply voltage VDD.

Thereafter, the sense amplifier activating signals PSA and NSA are activated, and the sense amplifier SA starts an amplifying operation. The sense amplifier SA amplifies the voltage difference between the voltage of the bit line BL and the precharge voltage VPR (the voltage of the bit line /BL; the reference voltage). As a result, the voltages of the bit lines BL and /BL change to the internal power supply voltage VII and the ground voltage VSS, respectively (FIG. 4(c)). The cell voltage STR of the memory cell MC lowers temporarily when this memory cell MC is connected to the bit line BL, but it rises up to the internal power supply voltage VII by the amplifying operation of the sense amplifier SA. That is, the "1 data" is written back into the memory cell MC (FIG. 4(d)).

Subsequently, the word line WL is inactivated, and the connection between the bit line BL and the memory cell MC is released (FIG. 4(e)). Thereafter, the sense amplifier activating signals PSA and NSA are inactivated, and the sense amplifier SA stops the amplifying operation (FIG. 4(f)). Besides, the precharge signal PREZ is activated, and the bit lines BL and /BL are set at the precharge voltage VPR (FIG. 4(g)).

When the ambient temperature is higher than the boundary temperature BT1, that is, it is the high temperature, the cell voltage STR retaining the "1 data" decreases due to a junction leak current (FIG. 4(h)). On this occasion, the precharge voltage VPR which is the reference voltage at the differential amplification of the sense amplifier SA has lowered as compared with its value at the low temperature, so that the read margin of the "1 data" becomes (VII/2−VP) equal to the read margin of "0 data" (FIG. 4(i)). Part of the large read margin of the "0 data" is allocated to the read margin of the "1 data", whereby the read margin of the "1 data" increases relatively. Accordingly, the worst value of a data retaining time can be lengthened, and a refresh cycle can be lengthened. Since the frequency of refreshes becomes low, power consumption can be reduced. Especially, a standby current can be reduced. As a result, the dissipation of a battery can be suppressed in a portable terminal in which the DRAM of the invention is mounted.

Figure 5:
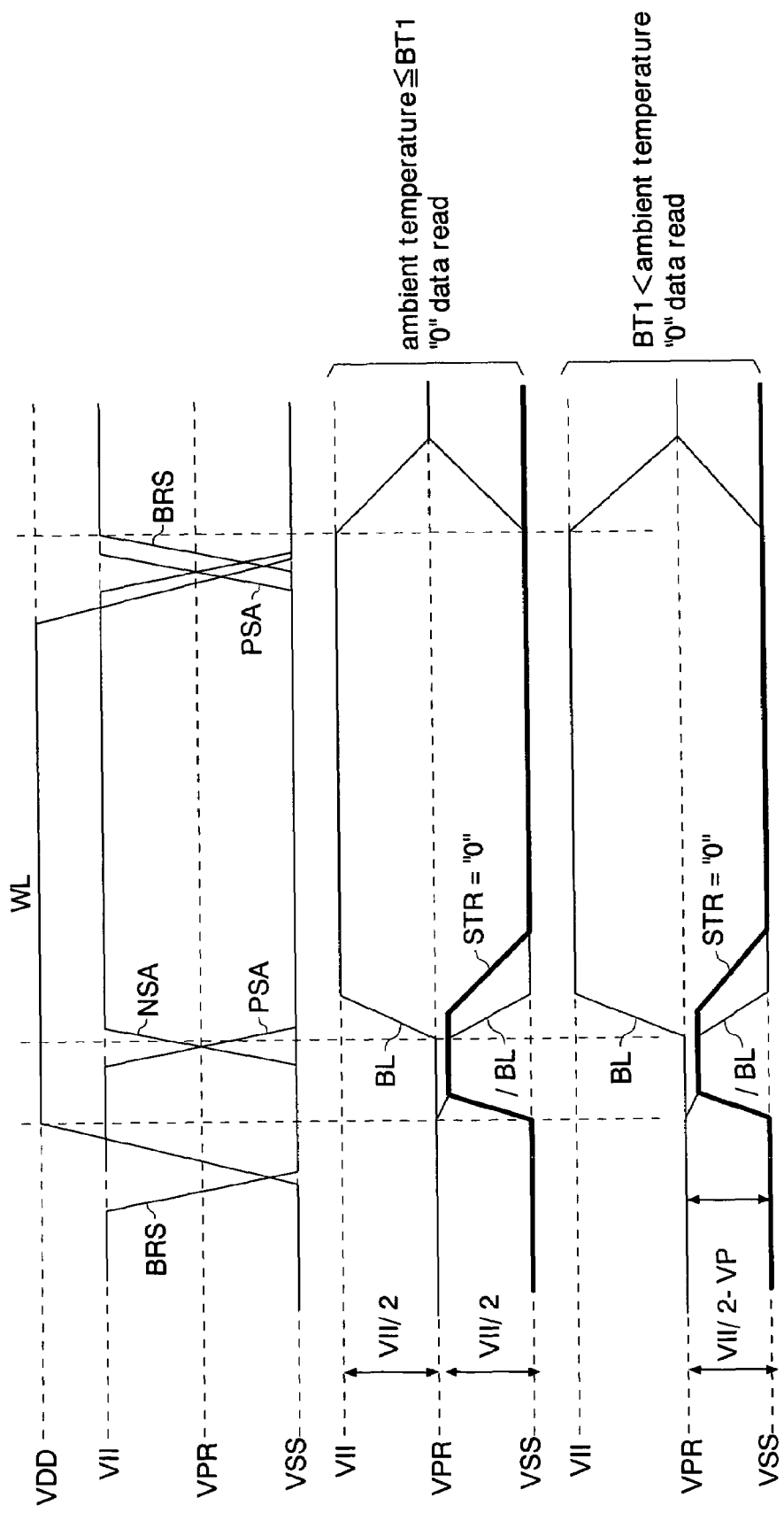
FIG. 5 is a waveform diagram showing the operation of the memory core in the case where "0 data" is read from the memory cell, in the first embodiment.

FIG. 5 shows the operation of the memory core 32 in the case where the "0 data" is read from the memory cell MC, in the first embodiment. The same operations as in FIG. 4 shall be omitted from detailed description. The waveforms of the precharge signal PREZ, word line WL, and sense amplifier activating signals PSA and NSA are the same as in FIG. 4.

In a case where the memory cell retains the "0 data" when the ambient temperature is higher than the boundary temperature BT1, that is, it is the high temperature, the decrease of the cell voltage STR proceeds due to a leak current which flows through a capacitor insulator having no temperature-dependency. On the other hand, as shown in FIG. 4, the precharge voltage VPR is set at (VII/2−VP) when the ambient temperature is higher than the boundary temperature BT1, in order to lengthen the data retaining time of the "1 data" at the high temperature. Therefore, the read margin of the "0 data" in the case where the ambient temperature is higher than the boundary temperature BT1 decreases more than in the case where the ambient temperature is equal to or lower than the boundary temperature BT1. As stated above, however, the decrement of the read margin of the "0 data" is allocated to the increment of the read margin of the "1 data", whereby the data retaining time (worst value) at the high temperature is enhanced more than in the prior art.

Figure 6:
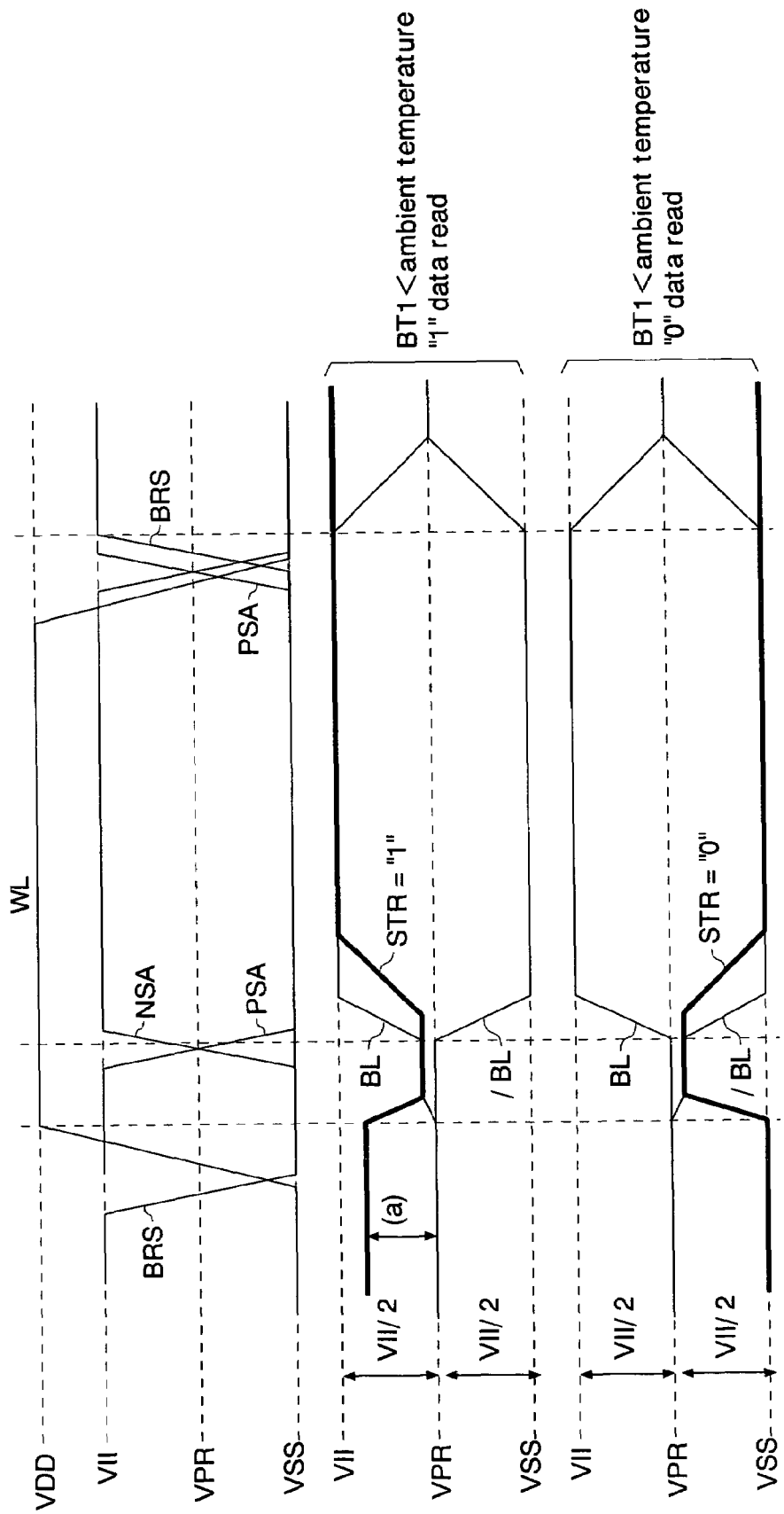
FIG. 6 is a waveform diagram showing the read operation of the memory core at a high temperature, before the invention.

FIG. 6 shows the read operation of the memory core at the high temperature, before the invention. The same operations as in FIG. 4 shall be omitted from detailed description.

The waveforms of the precharge signal PREZ, word line WL, and sense amplifier activating signals PSA and NSA are the same as in FIG. 4. The precharge voltage VPR in the prior art has been constant (VII/2) irrespective of the ambient temperature. Therefore, the read margin of the "1 data" lowers at the high temperature at which the cell voltage STR becomes low due to the junction leak current (FIG. 6(a)). On the other hand, the read margin of the "0 data" is equivalent to that at the low temperature, even at the high temperature, because any temperature-dependency does not exist. Accordingly, the difference between the read margin of the "1 data" and the read margin of the "0 data" becomes large at the high temperature. As a result, the worst value of the data retaining time has shortened due to the lowering of the read margin of the "1 data" at the high temperature, and it has been necessary to heighten the frequency of refreshes.

Figure 7:
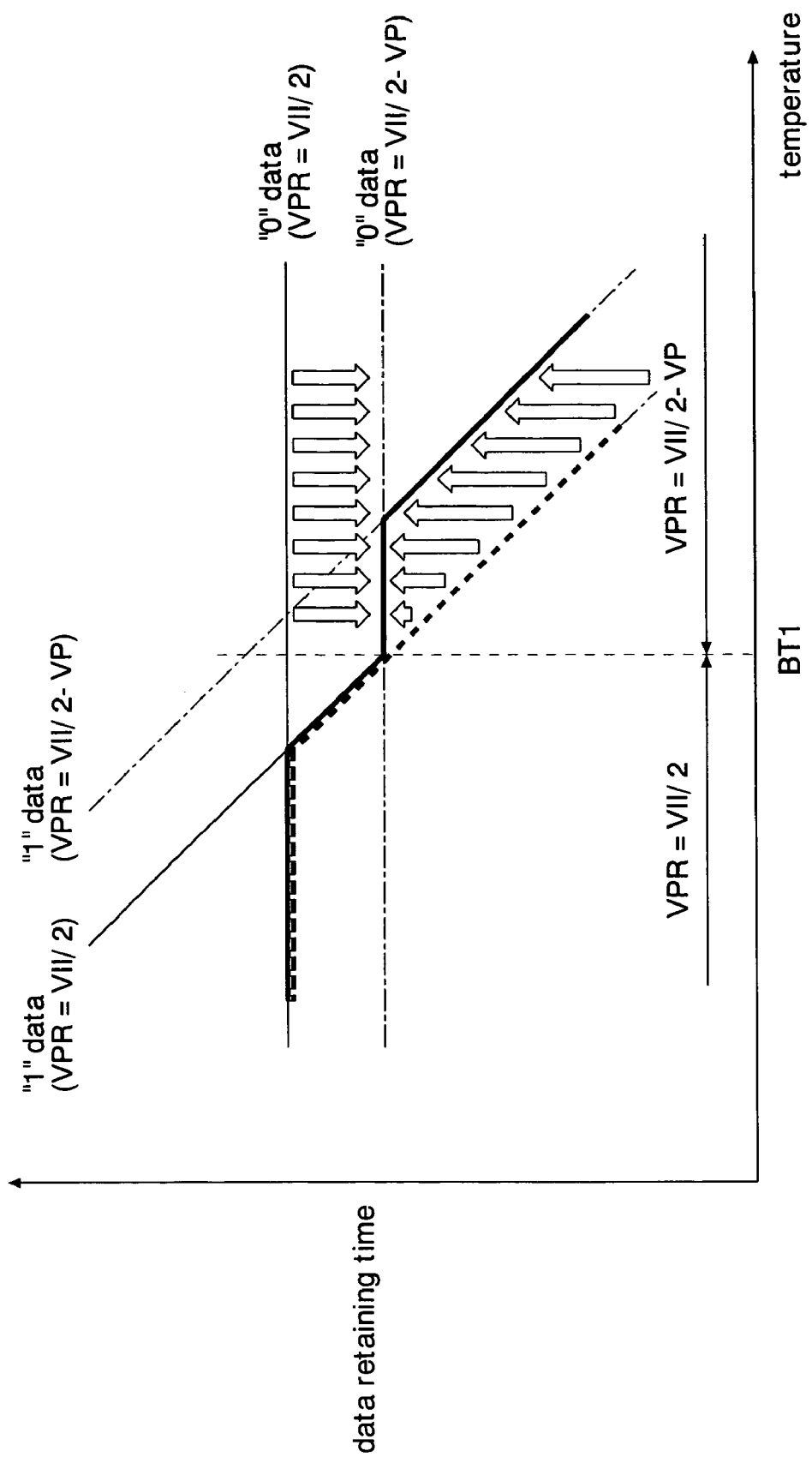
FIG. 7 is an explanatory diagram showing the relationship between a data retaining time and a temperature in the first embodiment.

FIG. 7 shows the relationship between the data retaining time of the DRAM of the first embodiment and the temperature. A fine solid line indicates a characteristic in the case where the precharge voltage VPR is VII/2, and a dot-and-dash line indicates a characteristic in the case where the precharge voltage VPR is (VII/2−VP). A thick solid line indicates the data retaining time (worst value) of the DRAM of the invention, and a thick broken line indicates the data retaining time (worst value) of the conventional DRAM.

In this example, a temperature at which the characteristic line of the "1 data" for the precharge voltage VPR of VII/2 and the characteristic line of the "0 data" for the precharge voltage VPR of (VII/2−VP) intersect is set at the boundary temperature BT1.

As stated above, when the ambient temperature is higher than the boundary temperature BT1, the precharge voltage VPR is set at (VII/2−VP). As indicated by bold arrows in the figure, therefore, the data retaining time of the "1 data" becomes long, and the data retaining time of the "0 data" becomes short. In a high-temperature state, however, the data retaining time of the "0 data" is longer than the data retaining time of the "1 data". Therefore, the data retaining time (worst value) exhibiting the performance of the DRAM can be extended by the application of the invention. It is consequently possible to lower the frequency of refreshes and to reduce the standby current.

As thus far described, in the first embodiment, when the ambient temperature has exceeded the boundary temperature BT1, the precharge voltage VPR is altered from VII/2 to (VII/2−VP). It is therefore possible to increase the read margin of the "1 data" and to lengthen the data retaining time of the "1 data". As a result, the frequency of the refreshes of the memory cell MC can be lowered, and the power consumption can be reduced. Especially, it is possible to reduce current consumption (the standby current) in the selfrefresh mode (standby period) in which only the refresh operations are cyclically executed.

Either of the two kinds of precharge voltages VPR is generated in accordance with the ambient temperature, whereby the switching control of the precharge generating circuit 24 is facilitated, and a circuit scale can be prevented from enlarging. As a result, the chip size of the DRAM can be prevented from increasing.

The temperature sensor 22 is built in the DRAM, whereby the ambient temperature can be precisely detected. As a result, the precharge voltage VPR can be generated at a high precision, and the data retaining timecan be controlled at a high precision in accordance with the ambient temperature.

Figure 8:
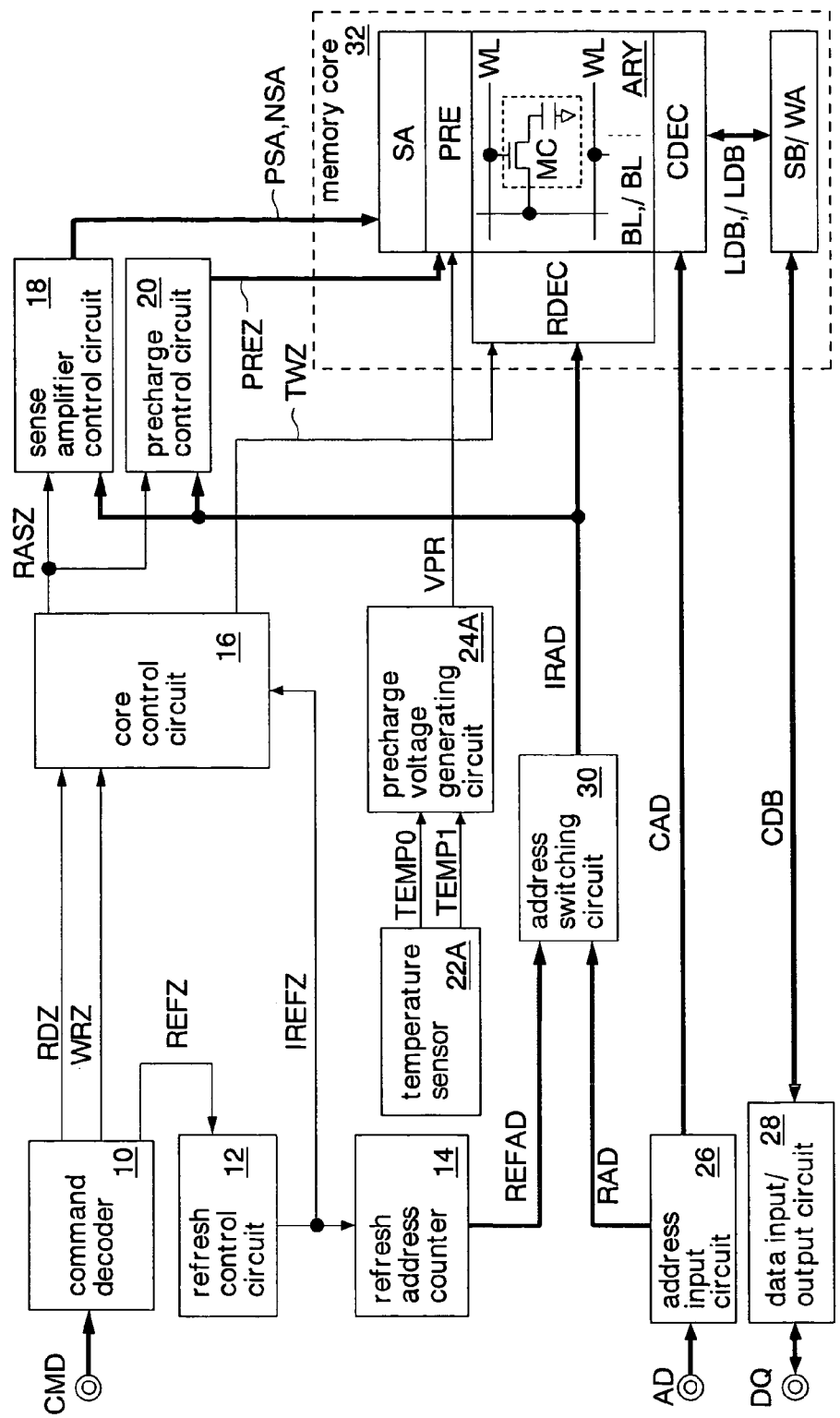
FIG. 8 is a block diagram showing the second embodiment of the semiconductor memory of the invention.

FIG. 8 shows the second embodiment of the semiconductor memory of the invention. The same constituents as in the first embodiment are assigned the same signs, and shall be omitted from detailed description. This semiconductor memory is formed as a DRAM chip by using a CMOS process on a silicon substrate. The DRAM is used as, for example, a work memory which is mounted in portable equipment such as mobile phone.

The DRAM includes a temperature sensor 22A and a precharge voltage generating circuit 24A instead of the temperature sensor 22 and the precharge voltage generating circuit 24 in the first embodiment. The remaining configuration is the same as in the first embodiment.

The temperature sensor 22A outputs temperature detection signals TEMP1-0 of 2 bits in accordance with the ambient temperature. That is, the temperature sensor 22A detects which of four temperature zones (TP1-TP4 in FIG. 10) the ambient temperature is included in, and it transmits the result of the detection to the precharge voltage generating circuit 24A. The precharge voltage generating circuit 24A generates any of three kinds of precharge voltages VPR in accordance with the temperature detection signals TEMP1-0, and it supplies the generated precharge voltage VPR (VPR1-VPR4 in FIG. 10) to the precharge circuit PRE.

Figure 9:
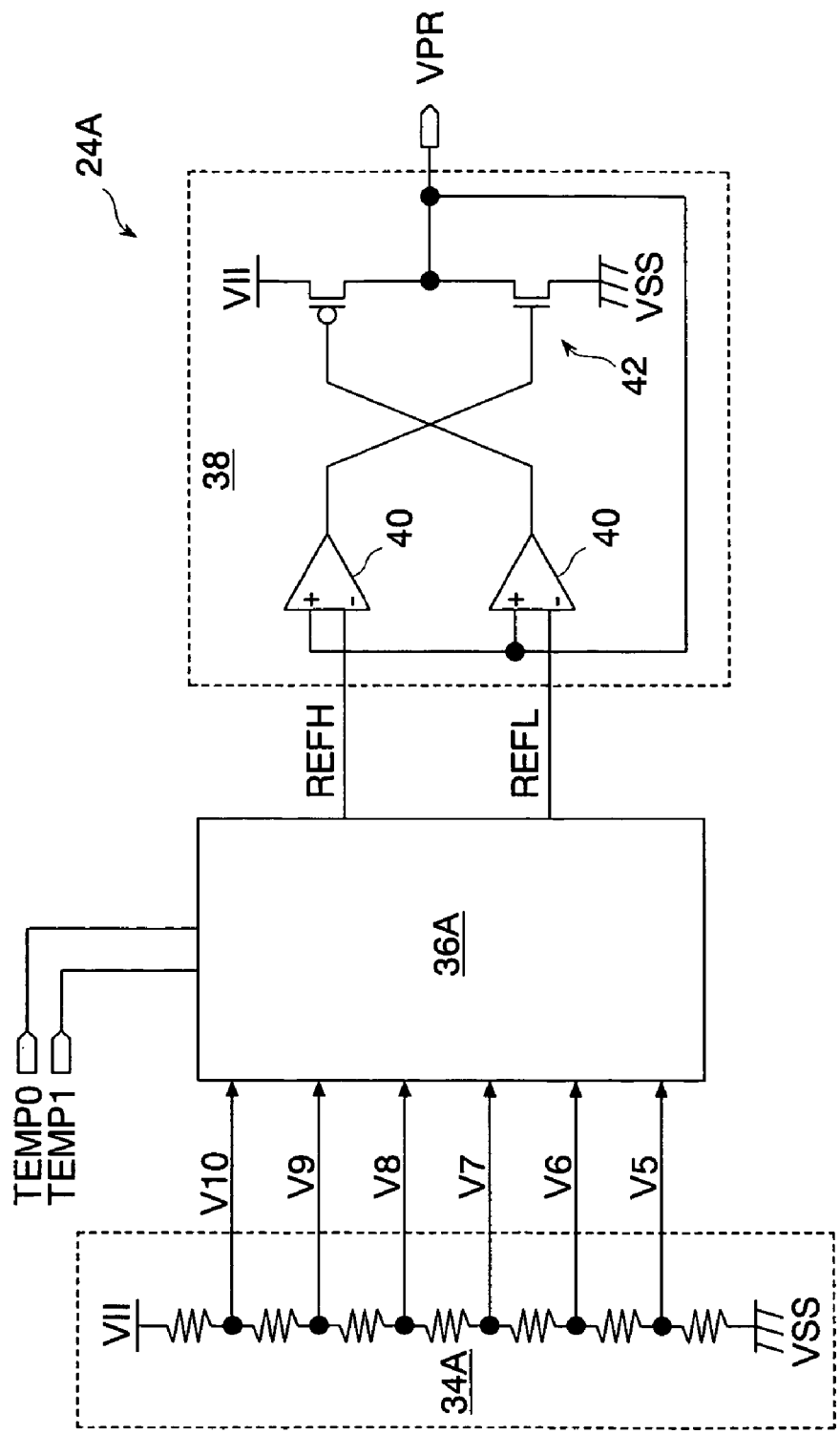
FIG. 9 is a block diagram showing the details of a precharge voltage generating circuit 24A shown in FIG. 8.

FIG. 9 shows the details of the precharge voltage generating circuit 24A shown in FIG. 8. The precharge voltage generating circuit 24A includes a reference voltage generating unit 34A, a switch unit 36A and a precharge voltage generating unit 38.

The reference voltage generating unit 34A includes a plurality of high-resistance resistors which are serially connected between the internal power supply line VII and the ground line VSS. Reference voltages V5-V10 are respectively outputted from the connection nodes of those two of the resistors which are adjacent to each other. The switch unit 36A selects any two of the reference voltages V5-V10 in accordance with the temperature detection signals TEMP1-0, and supplies the selected voltages to the precharge voltage generating unit 38 as reference voltages REFL and REFH (REFL<REFH).

In addition, the precharge voltage generating unit 38 generates any of the four kinds of precharge voltages VPR1-VPR4 (VPR1>VPR2>VPR3>VPR4) as the precharge voltage VPR in accordance with the reference voltages REFL and REFH. In the same manner as in the first embodiment, the precharge voltage VPR is set to be lower as the ambient temperature is higher.

Figure 10:
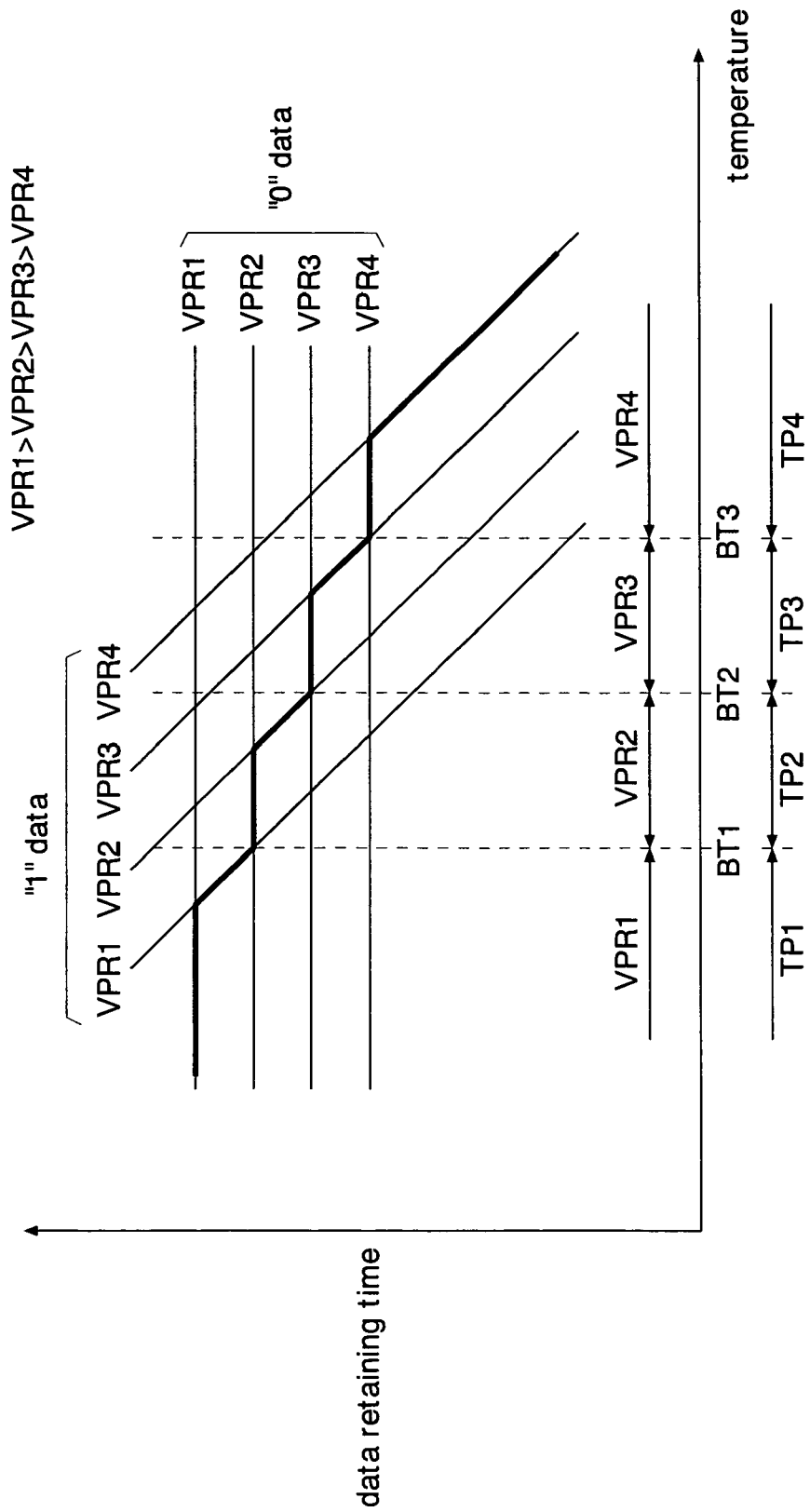
FIG. 10 is an explanatory diagram showing the relationship between a data retaining time and a temperature in the second embodiment.

FIG. 10 shows the relationship between the data retaining time of the DRAM of the second embodiment and the temperature. A thick solid line indicates the data retaining time (worst) of the DRAM of the invention. In this example, the ambient temperature rises to successively shifts into the temperature zones TP1-TP4, and each time the ambient temperature exceeds boundary temperatures BT1, BT2 and BT3, the precharge voltage VPR changes from VPR1 to VPR2, from VPR2 to VPR3, and from VPR3 to VPR4 and lowers gradually. In a case where the ambient temperature falls, reverse changes proceed.

As thus far described, the same advantages as in the first embodiment can be attained also in the second embodiment. Further, the plurality of kinds of precharge voltages VPR1-VPR4 are switched in accordance with the ambient temperature, whereby the data retaining time can be lengthened more, and the frequency of refreshes can be lowered.

Figure 11:
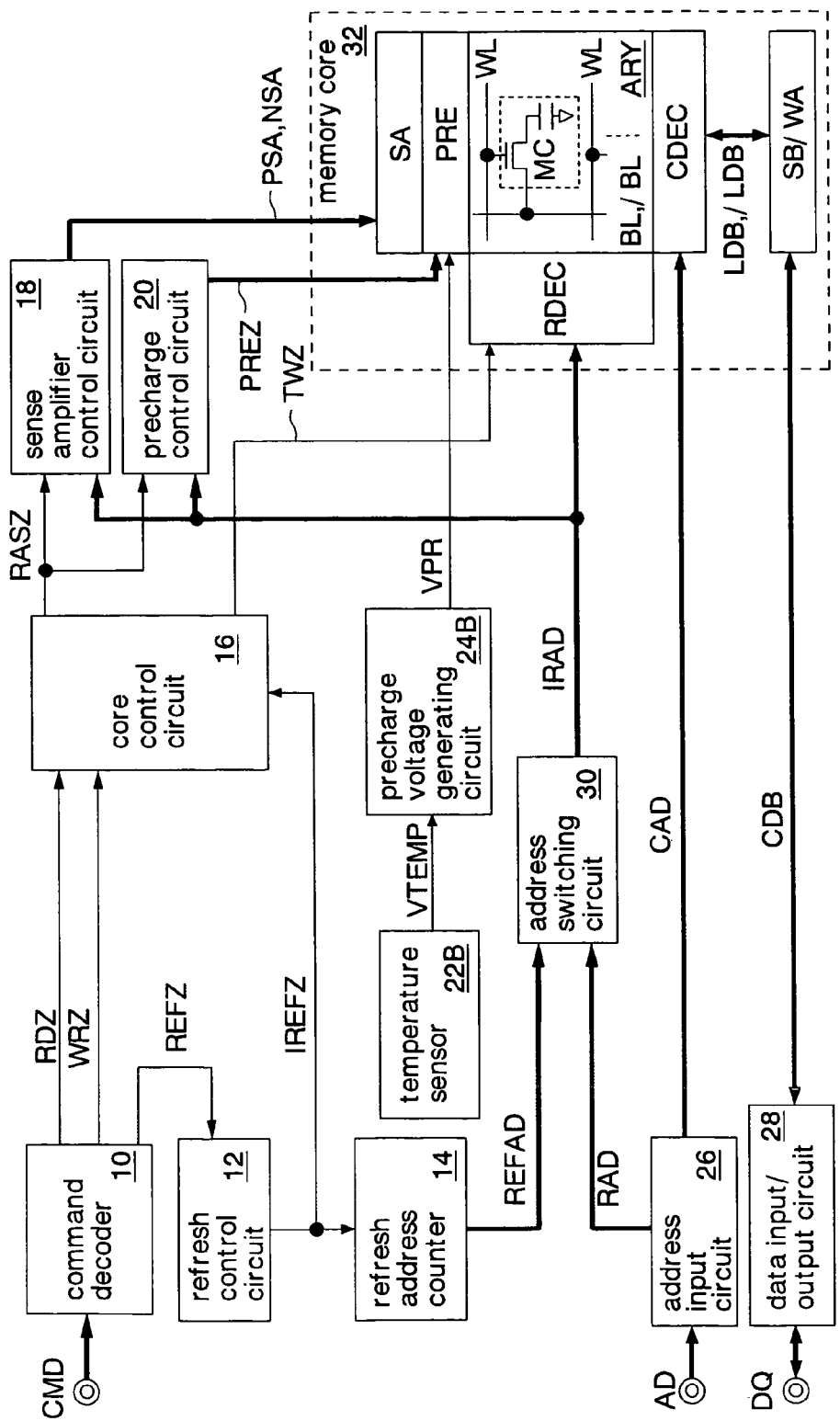
FIG. 11 is a block diagram showing the third embodiment of the semiconductor memory of the invention.

FIG. 11 shows the third embodiment of the semiconductor memory of the invention. The same constituents as in the first embodiment are assigned the same signs, and shall be omitted from detailed description. This semiconductor memory is formed as a DRAM chip by using a CMOS process on a silicon substrate. The DRAM is used as, for example, a work memory which is mounted in portable equipment such as mobile phone.

The DRAM includes a temperature sensor 22B and a precharge voltage generating circuit 24B instead of the temperature sensor 22 and the precharge voltage generating circuit 24 in the first embodiment. The remaining configuration is the same as in the first embodiment.

The temperature sensor 22B outputs a temperature detection voltage VTEMP (an analog value, and a temperature detection signal) according to the ambient temperature. That is, the temperature sensor 22B outputs the temperature detection voltage VTEMP which changes continuously in accordance with the ambient temperature. The temperature detection voltage VTEMP becomes higher as the ambient temperature is higher.

The precharge voltage generating circuit 24B includes, for example, a pMOS transistor (not shown) which receives the temperature detection voltage VTEMP at its gate, whose source is connected to the internal power supply line VII and which outputs the precharge voltage VPR from its drain. Therefore, when the temperature detection voltage VTEMP rises (when the ambient temperature becomes high), the precharge voltage VPR lowers, and when the temperature detection voltage VTEMP lowers (when the ambient temperature becomes low), the precharge voltage VPR rises. That is, in this embodiment, the precharge voltage VPR changes continuously in accordance with the ambient temperature.

Figure 12:
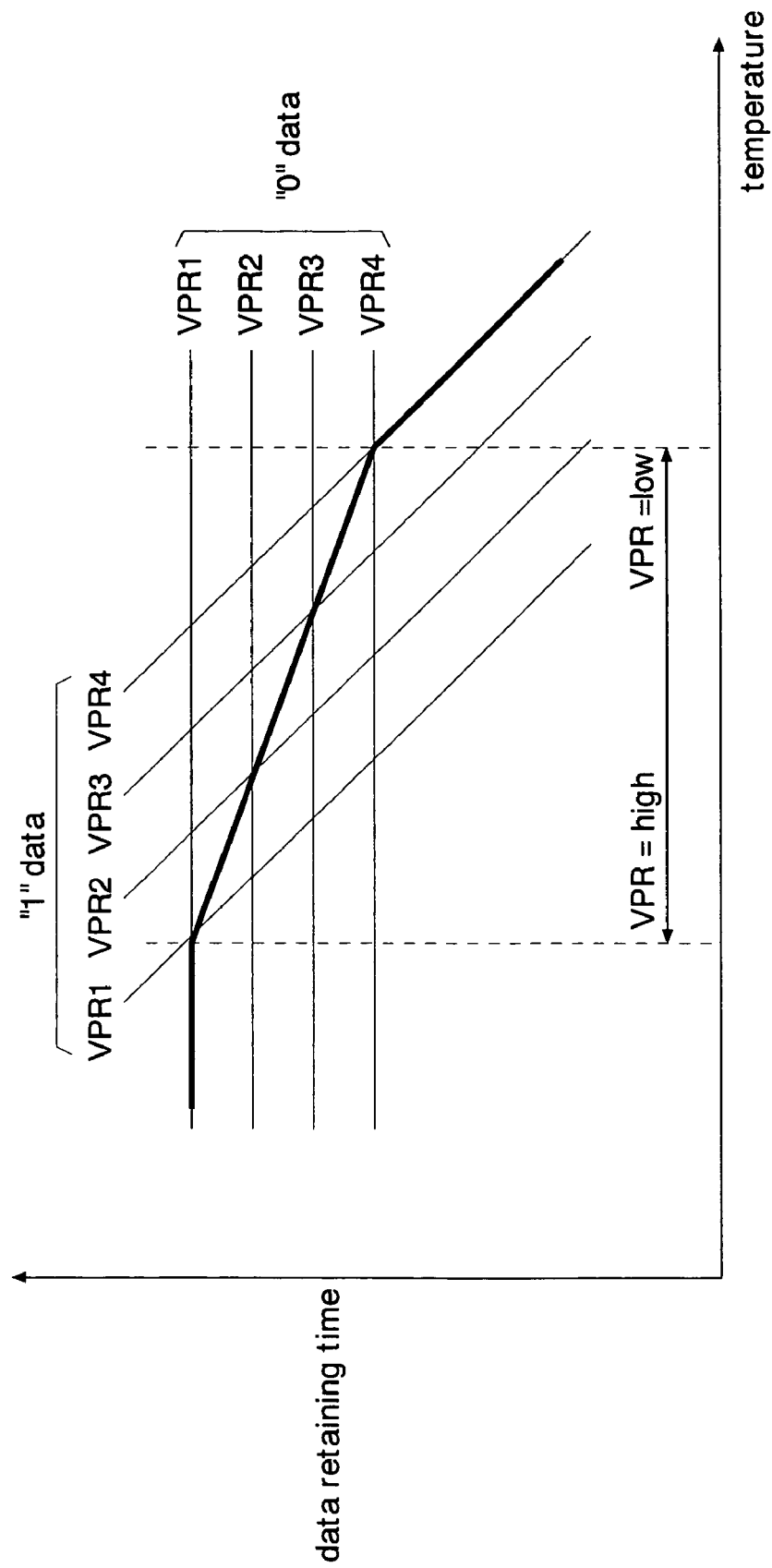
FIG. 12 is an explanatory diagram showing the relationship between a data retaining time and a temperature in the third embodiment.

FIG. 12 shows the relationship between the data retaining time of the DRAM and the temperature in the third embodiment. A thick solid line indicates the data retaining time (worst) of the DRAM of the invention. Besides, the precharge voltages VPR1-VPR4 used in the second embodiment are indicated for the sake of reference. As shown in the figure, in this embodiment, the precharge voltage VPR changes continuously, whereby also the data retaining time changes continuously.

As thus far described, the same advantages as in the first and second embodiments can be attained also in the third embodiment. Further, the precharge voltage VPR is generated in accordance with the temperature detection voltage VTEMP which changes continuously in accordance with the ambient temperature, whereby the precharge voltage VPR can be continuously changed. As a result, the data retaining time of the memory cell MC can be controlled at a high precision in accordance with the ambient temperature. Moreover, the precharge voltage generating circuit 24B can be easily configured by employing the transistor or the like without forming the large number of resistors as shown in FIG. 9.

Figure 13:
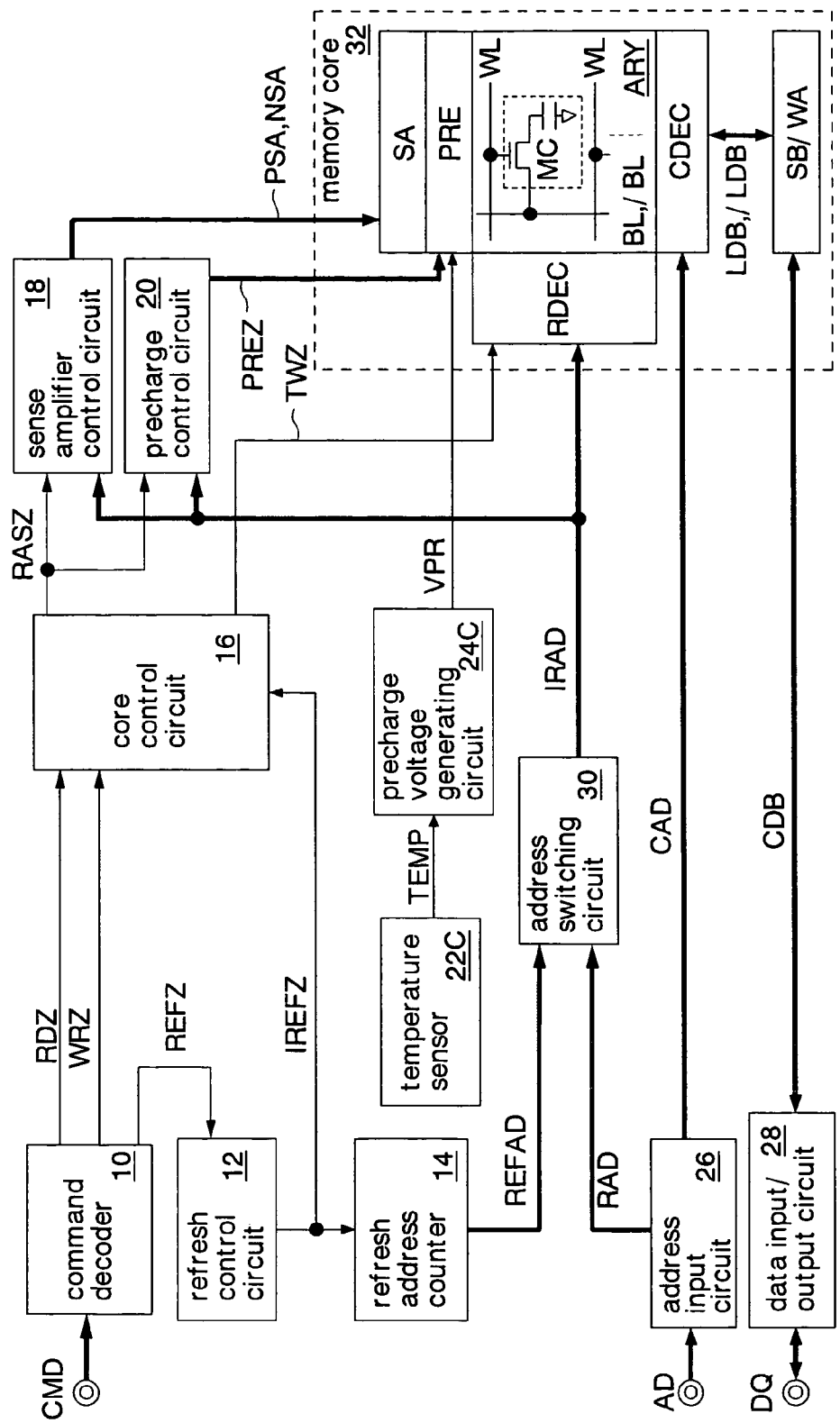
FIG. 13 is a block diagram showing the fourth embodiment of the semiconductor memory of the invention.

FIG. 13 shows the fourth embodiment of the semiconductor memory of the invention. The same constituents as in the first embodiment are assigned the same signs, and shall be omitted from detailed description. This semiconductor memory is formed as a DRAM chip by using a CMOS process on a silicon substrate. The DRAM is used as, for example, a work memory which is mounted in portable equipment such as mobile phone.

The DRAM includes a temperature sensor 22C and a precharge voltage generating circuit 24C instead of the temperature sensor 22 and the precharge voltage generating circuit 24 in the first embodiment. The remaining configuration is the same as in the first embodiment. The precharge voltage generating circuit 24C sets the precharge voltage VPR at VII/2 when the ambient temperature is higher than the boundary temperature BT2 (for example, 10° C.), and it sets the precharge voltage VPR at a voltage higher than VII/2, when the ambient temperature is lower than the boundary temperature BT2, that is, when it is a low temperature.

Figure 14:
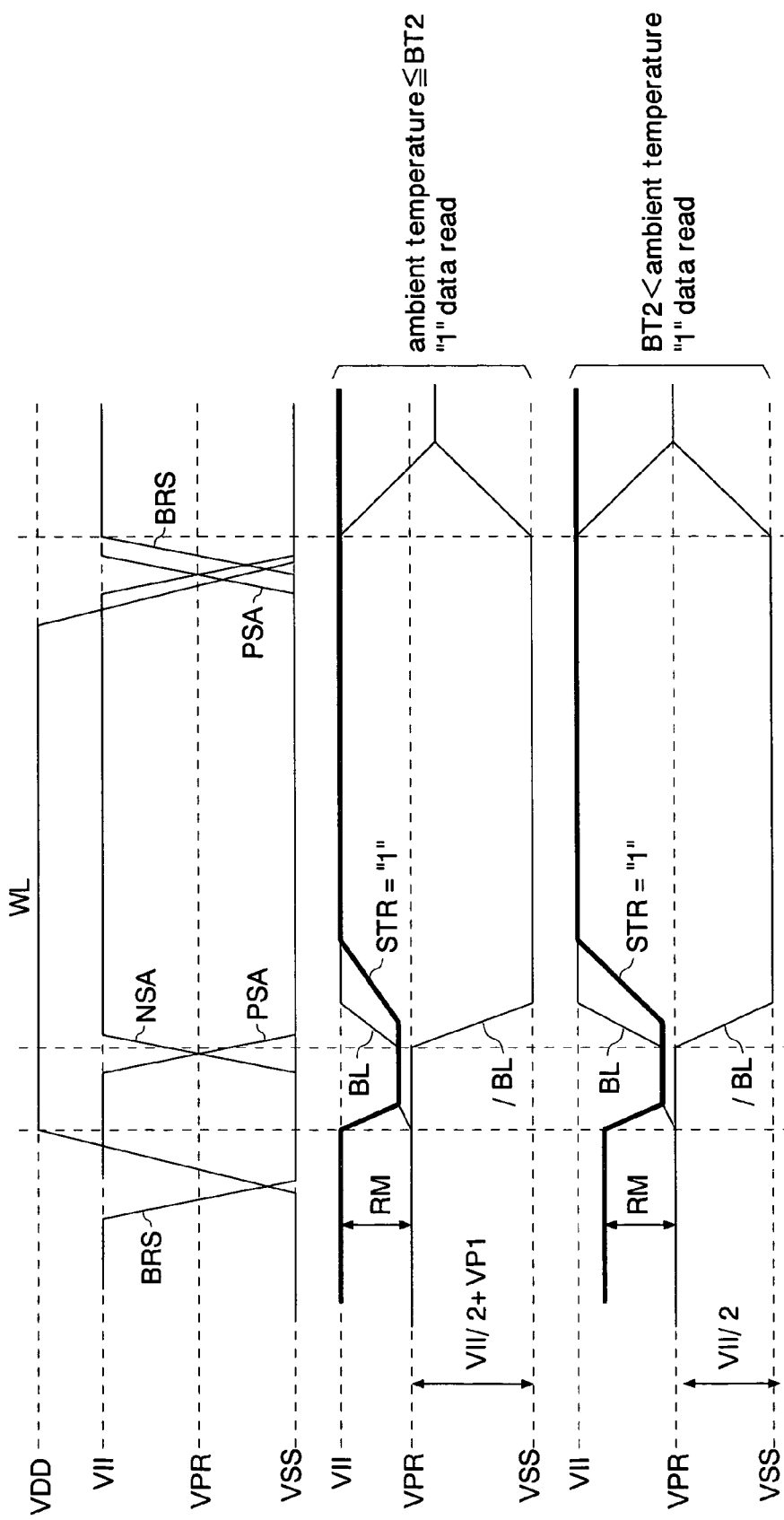
FIG. 14 is a waveform diagram showing the operation of the memory core in the case where "1 data" is read from the memory cell, in the fourth embodiment.

FIG. 14 shows the operation of the memory core 32 in the case where the "1 data" is read from the memory cell MC, in the fourth embodiment. The same operations as in FIG. 4 shall be omitted from detailed description. The waveforms of the precharge signal PREZ, word line WL, and sense amplifier activating signals PSA and NSA are the same as in FIG. 4.

In this embodiment, the precharge voltage VPR is set to be high at the low temperature. The precharge voltage VPR is heightened at the low temperature, whereby the read margin of the "1 data" decreases. At a normal temperature and at a high temperature, the read margin of the "1 data" decreases due to the fall of the cell voltage STR attributed to the junction leak current. Accordingly, the difference between the read margins RM of the "1 data" at the low temperature and at the high temperature becomes small. Incidentally, at the low temperature, a leak current from the memory cell MC is very small, so that the read margin is originally sufficient. Therefore, even when the precharge voltage VPR is raised at the low temperature, the influence of the lowering of the read margin is little. As a result, the frequency of refreshes can be lowered, and the standby current can be reduced, by the application of the invention.

As thus far described, the same advantages as in the first embodiment can be attained also in the fourth embodiment. That is, the read margin of the "1 data" at the low temperature as is originally sufficient is decreased and is allocated to the read margin of the "0 data", whereby the data retaining time (worst value) at the low temperature can be lengthened. As a result, the frequency of the refreshes lowers, and the standby current can be reduced.

Figure 15:
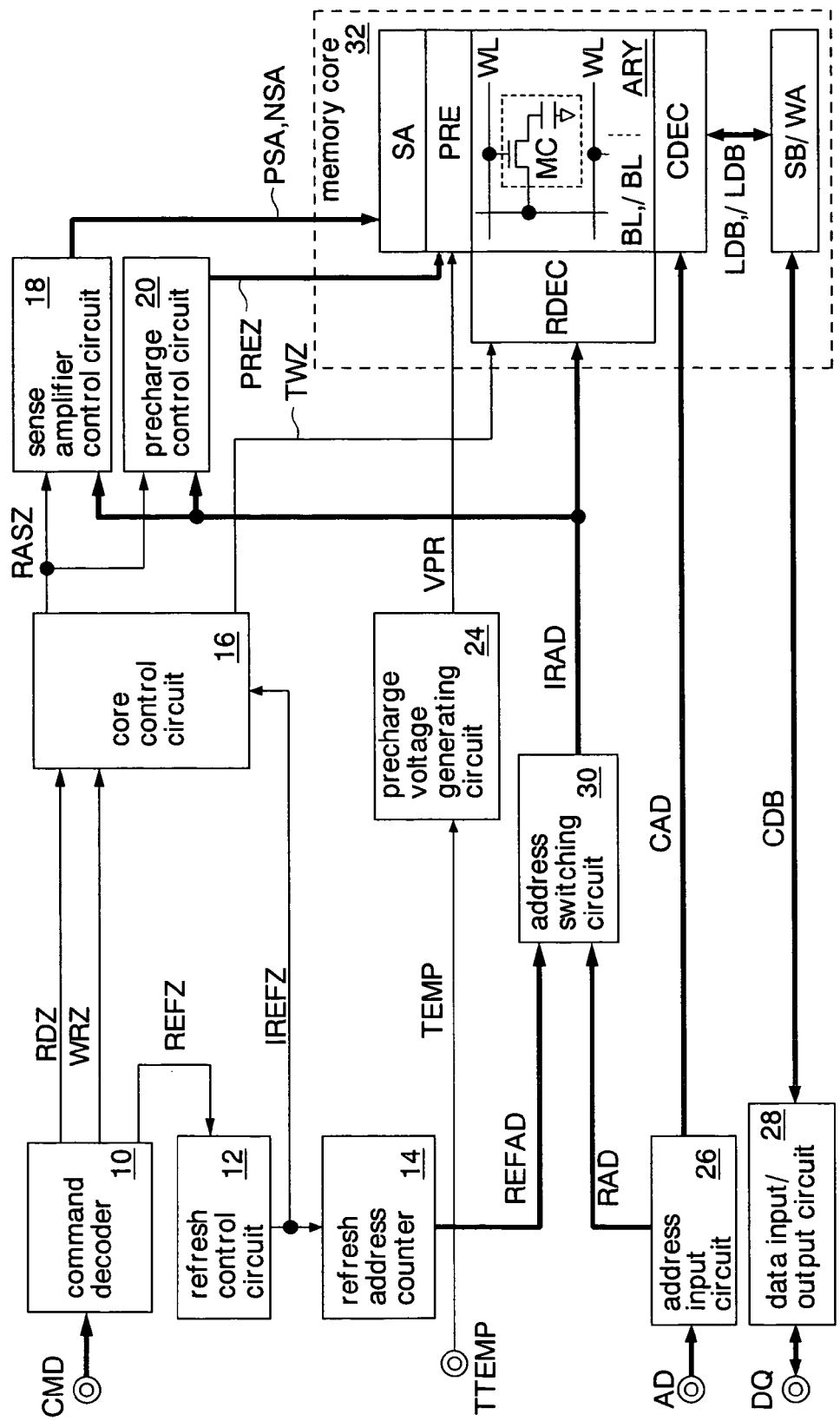
FIG. 15 is a block diagram showing the fifth embodiment of the semiconductor memory of the invention.

FIG. 15 shows the fifth embodiment of the semiconductor memory of the invention. The same constituents as in the first embodiment are assigned the same signs, and shall be omitted from detailed description. This semiconductor memory is formed as a DRAM chip by using a CMOS process on a silicon substrate. The DRAM is used as, for example, a work memory which is mounted in portable equipment such as mobile phone.

The DRAM includes a temperature terminal (external terminal) TTEMP which receives a temperature detection signal TEMP, instead of the temperature sensor 22 in the first embodiment. The remaining configuration is the same as in the first embodiment. The temperature detection signal TEMP is outputted from a temperature sensor which is built in the portable terminal incorporating the DRAM. In the same manner as in the first embodiment, the built-in temperature detection signal TEMP is set at its high level when the ambient temperature is lower than the boundary temperature BT1 (for example, 40° C.), and it is set at its low level when the ambient temperature is higher than the boundary temperature BT1.

In this embodiment, the precharge voltage generating circuit 24 receives the temperature detection signal TEMP which is supplied from outside the DRAM through the temperature terminal TTEMP. In the same manner as in the first embodiment, the precharge voltage generating circuit 24 sets the precharge voltage VPR at VII/2 when the temperature detection signal TEMP is at the high level, and it sets the precharge voltage VPR at a value lower than VII/2, when the temperature detection signal TEMP is at the low level.

As thus far described, the same advantages as in the first embodiment can be attained also in the fifth embodiment. Further, in the case where the temperature sensor is built in the portable terminal incorporating the DRAM, the output of the temperature sensor is utilized, whereby circuitry can be prevented from becoming redundant, and a system cost can be reduced.

Figure 16:
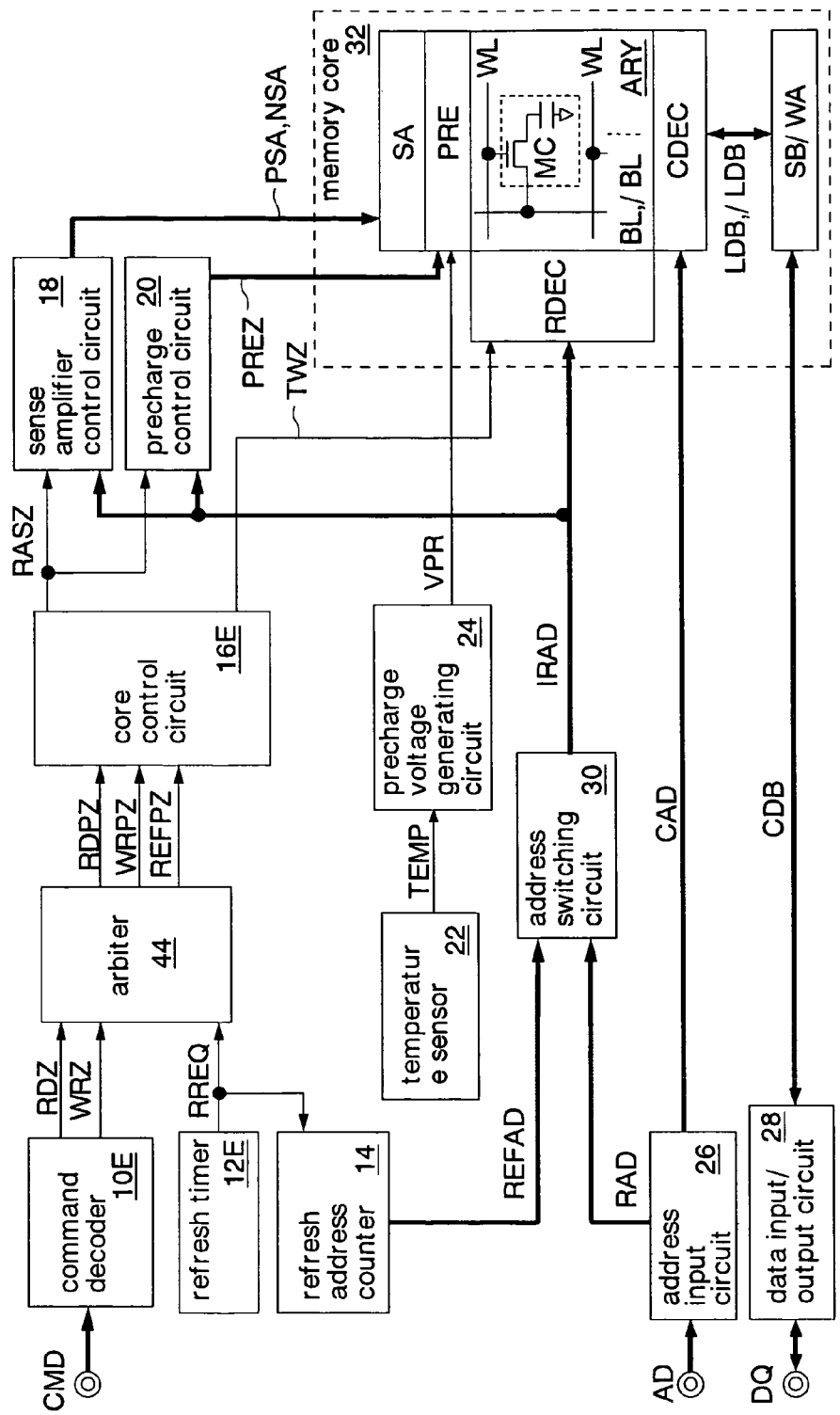
FIG. 16 is a block diagram showing the sixth embodiment of the semiconductor memory of the invention.

FIG. 16 shows the sixth embodiment of the semiconductor memory of the invention. The same constituents as in the first embodiment are assigned the same signs, and shall be omitted from detailed description. This semiconductor memory is formed as a pseudo static RAM chip (hereinafter, "pseudo SRAM") by using a CMOS process on a silicon substrate. The pseudo SRAM is used as, for example, a work memory which is mounted in portable equipment such as mobile phone.

The pseudo SRAM includes the memory core of a DRAM, and it has the interface of an SRAM. The pseudo SRAM executes refresh operations periodically within the chip, without receiving any refresh command from outside, thereby to retain data written into a memory cell. A period for which any access request (a read command or a write command) is not received from outside is a standby period, and a current consumption on this occasion is a standby current. That is, during the standby period, only the refresh operations are cyclically executed in the same manner as in the selfrefresh mode of the DRAM.

The pseudo SRAM includes a command decoder 10E, a refresh timer 12E, a refresh address counter 14, an arbiter 44, a core control circuit 16E, a sense amplifier control circuit 18, a precharge control circuit 20, a temperature sensor 22, a precharge voltage generating circuit 24, an address input circuit 26, a data input/output circuit 28, an address switching circuit 30 and the memory core 32. Note that, in FIG. 16, only principal signals necessary for the description of the invention are shown.

The command decoder 10E receives a command signal CMD supplied from an external terminal (for example, a chip enable signal /CE, a write enable signal /WE, and an output enable signal /OE). In compliance with the received command signal CMD, the command decoder 10E outputs a read control signal RDZ for executing a read operation, a write control signal WRZ for executing a write operation, and so forth. In the pseudo SRAM, the refresh command is generated only within the chip without being received from outside. The refresh timer 12E outputs a refresh request signal RREQ at a predetermined cycle.

The arbiter 44 determines which of the read command and write command (command signals CMD) supplied from outside and the refresh command (refresh request signal RREQ) generated inside is given priority to, and it outputs any of a read control signal RDPZ, a write control signal WRPZ and a refresh control signal REFPZ to the core control circuit 16E. The function of the core control circuit 16E is the same as that of the core control circuit 16 in the first embodiment, except the point that the refresh control signal REFPZ is received instead of the internal refresh control signal IREFZ. The refresh address counter 14 executes a count operation in response to the refresh request signal RREQ, so as to sequentially generate refresh address signals REFAD.

As thus far described, the same advantages as in the first embodiment can be attained also in the sixth embodiment. That is, also in the pseudo SRAM, the frequency of refreshes can be lowered, and the standby current can be reduced, by the application of the invention.

The examples in which the invention is applied to the DRAM have been stated in the foregoing second-fifth embodiments. The invention is not restricted to such embodiments. By way of example, the temperature sensor 22A and precharge voltage generating circuit 24A in the second embodiment, the temperature sensor 22B and precharge voltage generating circuit 24B in the third embodiment, the temperature sensor 22C and precharge voltage generating circuit 24C in the fourth embodiment, and the external terminal TEMP in the fifth embodiment may well be respectively applied to the pseudo SRAM.

The examples in which the invention is applied to the DRAM chip or the pseudo SRAM chip have been stated in the foregoing embodiments. The invention is not restricted to such embodiments. By way of example, even when the invention is applied to a DRAM core or a pseudo SRAM core which is packaged in a system LSI, the same advantages can be attained.

The invention is not limited to the above embodiments and various modifications may be made without departing from the spirit and scope of the invention. Any improvement may be made in part or all of the components.

What is claimed is:

1. A semiconductor memory comprising:
   a dynamic memory cell;
   a bit line which is connected to said dynamic memory cell;
   a first precharge voltage generating circuit which outputs any of a plurality of precharge voltages in accordance with an ambient temperature;
   a precharge circuit which supplies the precharge voltage supplied from said first precharge voltage generating circuit, to said bit line during nonaccess to said dynamic memory cell; and
   a sense amplifier which amplifies a difference between a voltage of a data signal read from said dynamic memory cell onto said bit line and the supplied precharge voltage,
   wherein the first precharge voltage generating circuit comprises:
   a reference voltage generating circuit that generates at least four reference voltages;
   a switch circuit that selects at least two reference voltages among the at least four reference voltages based on a temperature detection signal which is generated according to the ambient temperature; and
   a second precharge voltage generating circuit that generates one of the plurality of precharge voltages based on the at least two reference voltages.

2. A semiconductor memory according to claim 1, wherein:
   said sense amplifier changes a voltage of said bit line to one of a power supply voltage VII and a ground voltage by an amplifying operation; and the plurality of precharge voltages include a first precharge voltage having a voltage VII/2 and a second precharge voltage having a voltage lower than VII/2.

3. A semiconductor memory according to claim 1 wherein:
said sense amplifier changes a voltage of said bit line to one of a power supply voltage VII and a ground voltage by an amplifying operation; and
the plurality of precharge voltages include a first precharge voltage having a voltage higher than VII/2 and a second precharge voltage having a voltage VII/2.

4. A semiconductor memory according to claim 1, further comprising
an external terminal which receives the temperature detection signal indicating the ambient temperature, wherein
said first precharge voltage generating circuit outputs any of the precharge voltages in accordance with the temperature detection signal.

5. A semiconductor memory according to claim 1, wherein the reference voltage generating circuit includes a resistor string having a plurality of resistors which are serially connected between a first power supply voltage and a second power supply voltage, wherein the at least two reference voltages are derived from a corresponding connection node of the resistor string.

6. A semiconductor memory according to claim 1, wherein the precharge voltage generating circuit includes a differential amplifier which compares one of the at least two reference voltages with one of the plurality of precharge voltages.

7. A semiconductor memory according to claim 1, wherein the at least two reference voltages are derived from a corresponding connection node of serially connected resistors.

8. A semiconductor memory according to claim 1, wherein the second precharge voltage generating circuit has a feedback line of the precharge voltage.

9. A semiconductor memory according to claim 1 wherein the first precharge voltage generating circuit generates a first precharge voltage when the ambient temperature is lower than a boundary temperature, and generates a second precharge voltage when the ambient temperature is higher than the boundary temperature.

10. A semiconductor memory according to claim 1 further comprising:
a temperature sensor which generates the temperature detection signal.

11. A semiconductor memory according to claim 9, wherein the first precharge voltage generating circuit generates the first precharge voltage when the ambient temperature is equal to the boundary temperature.

12. A semiconductor memory according to claim 9, wherein the first precharge voltage is higher than the second precharge voltage.

13. A semiconductor memory comprising:
a dynamic memory cell;
a bit line which is connected to said dynamic memory cell;
a first precharge voltage generating circuit that outputs any of a plurality of precharge voltages in accordance with an ambient temperature;
a precharge circuit which supplies the precharge voltage supplied from said first precharge voltage generating circuit, to said bit line during nonaccess to said dynamic memory cell; and
a sense amplifier which amplifies a difference between a voltage of a data signal read from said dynamic memory cell onto said bit line and the supplied precharge voltage,
wherein the first precharge voltage generating circuit comprises:
a reference voltage generating circuit that generates a plurality of reference voltages;
a switch circuit that selects at least two reference voltages from the plurality of reference voltages based on a temperature detection signal which is generated according to the ambient temperature; and
a second precharge voltage generating circuit that generates one of the plurality of precharge voltages having a voltage between the at least two reference voltages.

14. A semiconductor memory according to claim 13, wherein:
said sense amplifier changes a voltage of said bit line to one of a power supply voltage VII and a ground voltage by an amplifying operation; and
the plurality of precharge voltages include a first precharge voltage having a voltage VII/2 and a second precharge voltage having a voltage lower than VII/2.

15. A semiconductor memory according to claim 13, wherein:
said sense amplifier changes a voltage of said bit line to one of a power supply voltage VII and a ground voltage by an amplifying operation; and
the plurality of precharge voltages include a first precharge voltage having a voltage higher than VII/2 and a second precharge voltage having a voltage VII/2.

16. A semiconductor memory according to claim 13, further comprising
an external terminal which receives the temperature detection signal indicating the ambient temperature, wherein
said first precharge voltage generating circuit outputs any of the precharge voltages in accordance with the temperature detection signal.

17. A semiconductor memory according to claim 13, wherein the reference voltage generating circuit includes a resistor string having a plurality of resistors which are serially connected between a first power supply voltage and a second power supply voltage, wherein the at least two reference voltages are derived from a corresponding connection node of the resister string.

18. A semiconductor memory according to claim 13, wherein the second precharge voltage generating circuit includes a differential amplifier which compares one of the at least two reference voltages with one of the plurality of precharge voltages.

19. A semiconductor memory according to claim 13, wherein the first precharge voltage generating circuit generates a first precharge voltage when the ambient temperature is lower than a boundary temperature, and generates a second precharge voltage when the ambient temperature is higher than the boundary temperature.

20. A semiconductor memory according to claim 13 further comprising:
a temperature sensor which generates the temperature detection signal.

* * * * *